(12) United States Patent
Sato et al.

(10) Patent No.: US 9,184,190 B2
(45) Date of Patent: Nov. 10, 2015

(54) PHOTODIODE ARRAY

(75) Inventors: Kenichi Sato, Hamamatsu (JP);
Kazuhisa Yamamura, Hamamatsu (JP);
Shinji Ohsuka, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/881,949

(22) PCT Filed: Oct. 24, 2011

(86) PCT No.: PCT/JP2011/074437
§ 371 (c)(1),
(2), (4) Date: Jul. 2, 2013

(87) PCT Pub. No.: WO2012/057082
PCT Pub. Date: May 3, 2012

(65) Prior Publication Data
US 2013/0270666 A1 Oct. 17, 2013

(30) Foreign Application Priority Data
Oct. 29, 2010 (JP) .................... 2010-244686

(51) Int. Cl.
*H01L 31/107* (2006.01)
*H01L 27/144* (2006.01)
(Continued)

(52) U.S. Cl.
CPC .......... *H01L 27/1446* (2013.01); *H01L 27/146* (2013.01); *H01L 31/02027* (2013.01); *H01L 27/14643* (2013.01)

(58) Field of Classification Search
CPC .............. H01L 27/1446; H01L 27/146; H01L 27/14643; H01L 31/02027

USPC ......... 257/290, 291, 438, 443, 448, 459, 461, 257/462, E31.079, E31.082, E31.111
See application file for complete search history.

(56) References Cited

U.S. PATENT DOCUMENTS

2007/0057161 A1* 3/2007 Koyama .................... 250/214 R
2009/0121306 A1 5/2009 Ishikawa
(Continued)

FOREIGN PATENT DOCUMENTS

CN 1928517 3/2007
CN 101484999 7/2009
(Continued)

OTHER PUBLICATIONS

H. Otono et al. "On the basic mechanism of Pixelized Photon Detectors", Nuclear Instruments and Methods in Physics Research A, vol. 610, 2009, p. 397-399.
(Continued)

*Primary Examiner* — Matthew E Warren
(74) *Attorney, Agent, or Firm* — Drinker Biddle & Reath LLP

(57) ABSTRACT

This photodiode array 10 includes quenching resistors 7 which are connected in series to respective avalanche photodiodes APDs, a peripheral wiring WL which surrounds a region in which the plurality of avalanche photodiodes APDs are formed, and a plurality of relay wirings 8 which are electrically connected to the peripheral wiring WL, so as to respectively connect at least two places of the peripheral wiring WL. One of an anode and a cathode of each avalanche photodiode APD is electrically connected to any one of the relay wirings 8 via the quenching resistor 7, and the other of the anode and the cathode of each avalanche photodiode APD is electrically connected to another electrode 6 provided on a semiconductor substrate.

9 Claims, 35 Drawing Sheets

(51) Int. Cl.
*H01L 27/146* (2006.01)
*H01L 31/02* (2006.01)

(56) References Cited

U.S. PATENT DOCUMENTS

2010/0148040 A1  6/2010  Sanfilippo et al.
2010/0301442 A1* 12/2010 Iwai et al. .................... 257/437

FOREIGN PATENT DOCUMENTS

| CN | 101789040 | 7/2010 |
|---|---|---|
| JP | 2002-033965 A | 1/2002 |
| JP | 2005-045125 A | 2/2005 |
| JP | 2008-103614 A | 5/2008 |
| WO | WO 2006/068184 | 6/2006 |
| WO | WO-2008/004547 A1 | 1/2008 |
| WO | WO 2010/098224 | 9/2010 |

OTHER PUBLICATIONS

C. Piemonte et al., "Characterization of the First Prototypes of Silicon Photomultiplier Fabricated at ITC-irst", IEEE Transactions on Nuclear Science, vol. 54, No. 1, Feb. 2007, p. 236-244.

* cited by examiner

Fig.8
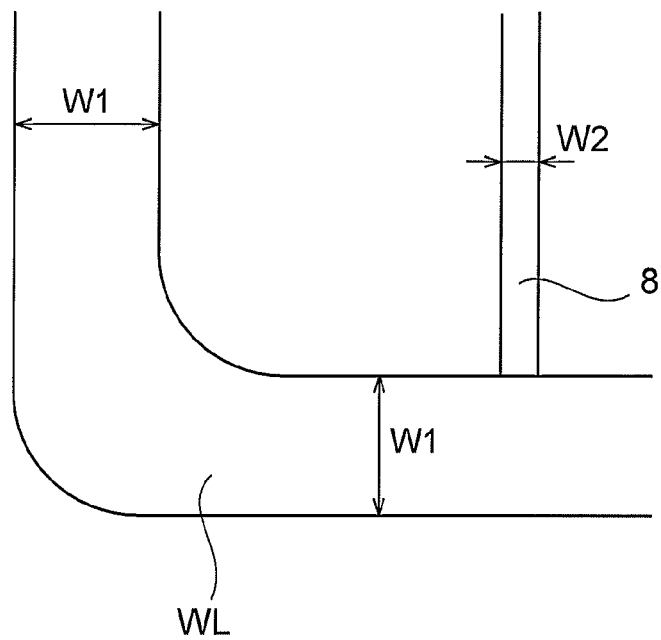
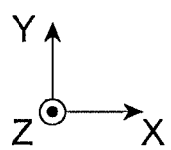

PHOTODIODE ARRAY

TECHNICAL FIELD

The present invention relates to a photodiode array.

BACKGROUND ART

A Multi-Pixel Photon Counter (MPPC: Registered Trademark) has been known as a photodiode array composed of a plurality of avalanche photodiodes (APDs) which are operated in the Geiger mode. The plurality of APDs are connected in parallel, and a reverse bias voltage higher than a breakdown voltage is applied to those, and those are operated in the Geiger mode. The MPPC includes quenching resistors which are connected in series to the avalanche photodiodes. An electric current from the avalanche photodiode to the quenching resistor, and the bias voltage to the avalanche photodiode drops down to the breakdown voltage. Thereafter, recharging causes the reverse bias voltage to return to the voltage in Geiger mode.

Because the MPPC has a temporal characteristic better than those of other detectors, it is considered promising that the MPPC is used as a detector such as a Time-Of-Flight (TOF) measurement system PET (Positron Emission Tomography) device. For photon measurement in a PET device, a higher temporal resolution is required. In order to improve a temporal resolution, it is necessary to acuminate a shape of an output waveform from the MPPC. The following non Patent Document 1 shows that an output pulse is acuminated, and the temporal resolution is improved by adding a capacitance (Cq) parallel to a quenching resistor.

CITATION LIST

Non Patent Literature

Non Patent Literature 1: H. Otono, et al., "On the basic mechanism of Pixelized Photon Detectors" Nucl. Instr. and Meth. A610 (2009)397.

SUMMARY OF INVENTION

Technical Problem

However, it is an important problem how to add a parallel capacitance in an actual device, and in the case where a capacitance is simply added, the time constants are increased by a capacitor and a resistor, which may degrade temporal resolution. The present invention has been achieved in consideration of such a problem, and an object of the present invention is to provide a photodiode array which is capable of considerably improving the temporal resolution.

Solution to Problem

In order to solve the above-described problems, a first photodiode array according to an aspect of the present invention, includes a plurality of avalanche photodiodes formed within a semiconductor substrate, quenching resistors which are connected in series to the respective avalanche photodiodes, a peripheral wiring which surrounds a region in which the plurality of avalanche photodiodes are formed, and a plurality of relay wirings which are electrically connected to the peripheral wiring, to respectively connect at least two places of the peripheral wiring, the photodiode array in which, a resistance value per unit length of the peripheral wiring is smaller than a resistance value per unit length of the relay wiring, one of an anode and a cathode of each of the avalanche photodiodes is electrically connected to any one of the relay wirings via the quenching resistor, and the other of the anode and the cathode of each of the avalanche photodiodes is electrically connected to another electrode provided on the semiconductor substrate.

In this case, an electric current from the relay wiring flows in a larger amount in a closer place (a place having lower resistance in a signal transmission path) of at least the two places of the peripheral wiring having the lower resistance value, to be taken out to the outside. Therefore, because it is possible to decrease a resistance value in a signal readout path, the time constant is decreased, thus the temporal resolution is improved.

A second photodiode array according to the aspect of the present invention further includes a transverse wiring which is electrically connected to the peripheral wiring, so as to connect at least two places of the peripheral wiring, and whose resistance value per unit length is smaller than a resistance value per unit length of the relay wiring, the photodiode array in which one ends of the respective relay wirings are electrically connected to the transverse wiring in place of the peripheral wiring.

In this case, an electric current from the relay wiring flows in a larger amount in a closer place (a place having lower resistance in a signal transmission path) of a place of connection with the peripheral wiring having the lower resistance value and a place of connection with the transverse wiring, to be taken out to the outside. Therefore, because it is possible to further decrease a resistance value in a signal readout path, a time constant is decreased, thus the temporal resolution is improved.

A third photodiode array according to the aspect of the present invention further includes capacitors which are respectively connected in parallel to the respective quenching resistors.

In this case, the temporal resolution is further improved.

In a fourth photodiode array according to the aspect of the present invention, either anodes or cathodes of the respective avalanche photodiodes are electrically connected to ring-shaped electrodes, the relay wirings include conductive peripheral regions which are spaced from the ring-shaped electrodes, and are extended so as to surround the ring-shaped electrodes, and the capacitors have the peripheral regions extended from the relay wirings, and the ring-shaped electrodes.

In this case, it is possible to configure the capacitor in a planar manner, and the temporal resolution is improved.

A fifth photodiode array according to the aspect of the present invention, in the fourth photodiode array, further includes intermediate wirings extended in parallel between the relay wirings, and the intermediate wirings respectively connect at least two places of the peripheral wiring, and the peripheral region continues into the intermediate wirings.

In this case, it is confirmed that it is possible to configure the capacitor in a planar manner, and the temporal resolution is improved.

In accordance with a sixth photodiode array according to the aspect of the present invention, in the fourth photodiode array, the peripheral regions are connected to both sides of the respective relay wirings, and the peripheral regions adjacent to one another are spaced with respect to the relay wirings adjacent to one another.

In this case, it is confirmed that it is possible to configure the capacitor in a planar manner, and the temporal resolution is improved.

In a seventh photodiode array according to the aspect of the present invention, the respective relay wirings open at regions along center lines thereof.

In this case, it is confirmed that it is possible to configure the capacitor in a planar manner, and the temporal resolution is improved. Further, a wiring capacitance of the relay wiring is reduced.

In accordance with an eighth photodiode array according to the aspect of the present invention, in any one of the above-described photodiode arrays, the capacitor has a covering wiring formed on the quenching resistor via an insulating layer, and one end of the covering wiring is electrically connected to one end of the quenching resistor. In this case, it is confirmed that it is possible to sterically configure the capacitor due to its lamination, thus it is possible to improve the element density, and the temporal resolution is improved.

In the eighth photodiode array according to the aspect of the present invention, either anodes or cathodes of the respective avalanche photodiodes are electrically connected to ring-shaped electrodes, and an aspect ratio of the ring-shaped electrode is 2 or higher. In this case, the capacitors are configured between the relay wirings and the ring-shaped electrodes which are spaced to run in parallel. However, because the aspect ratio is high, it is possible to increase the capacitance of the capacitor. Accordingly, the proportion of the capacitor with respect to an opening ratio of the ring-shaped electrode is increased, and the element density of the capacitor is increased. Accordingly, it is confirmed that it is possible to improve the space resolution by downsizing the ring-shaped electrode, and the temporal resolution is improved.

Advantageous Effect of Invention

In accordance with the photodiode array according to the aspect of the present invention, it is possible to considerably improve the temporal resolution.

BRIEF DESCRIPTION OF DRAWINGS

FIG. 8 is a plan view of wirings.

DESCRIPTION OF EMBODIMENTS

Figure 1:
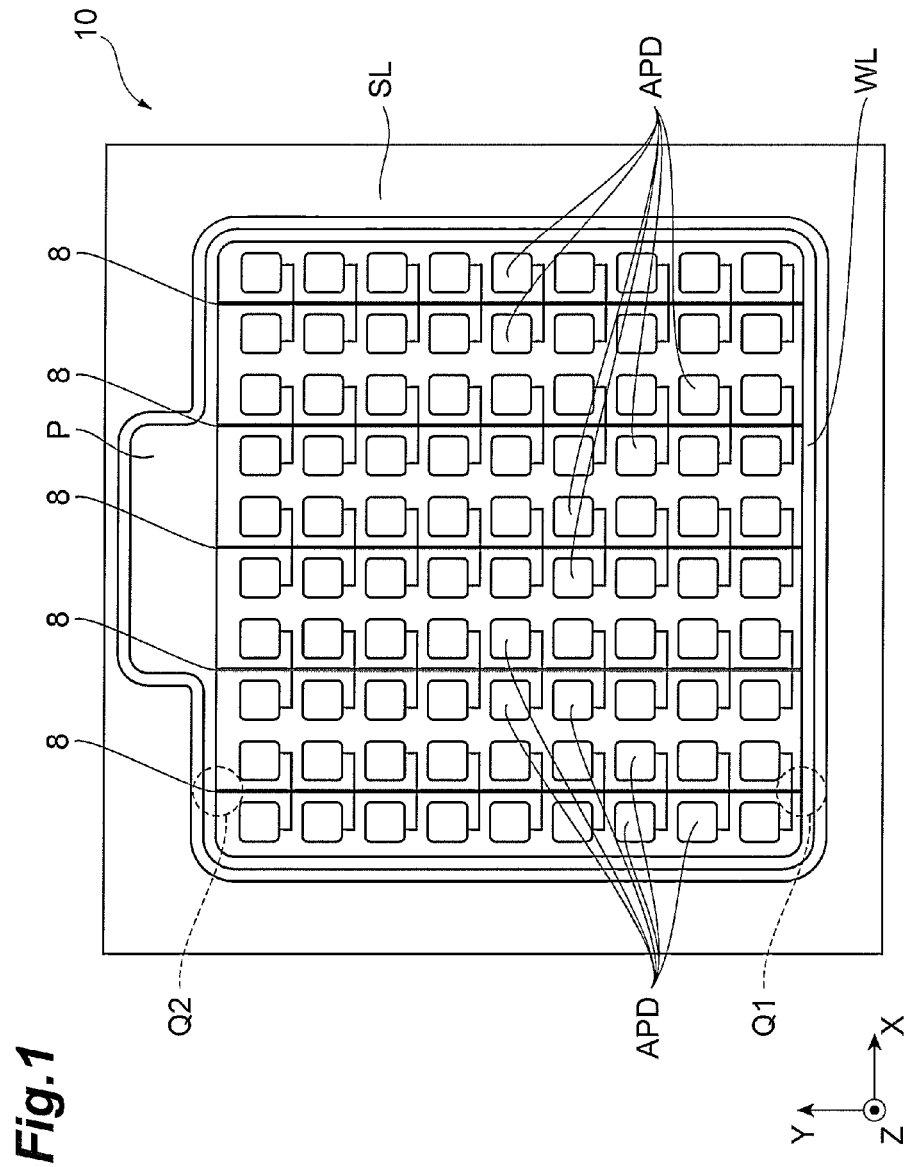
FIG. 1 is a plan view of a photodiode array.

Hereinafter, a photodiode array according to an embodiment will be described. In addition, the same reference numerals are to be used for the same components, and overlapping descriptions will be omitted.

FIG. 1 is a plan view of a photodiode array 10.

As illustrated, the X-Y-Z orthogonal coordinate system is set, and the thickness direction of the photodiode array 10 coincides with the Z axis, and the optical incidence plane of the photodiode array 10 coincides with the X-Y plane. The photodiode array 10 includes a semiconductor substrate 20, and the shape of the semiconductor substrate 20 is a rectangle shape, and each side thereof is parallel to the X-axis or the Y-axis.

The photodiode array 10 includes a plurality of avalanche photodiodes APDs formed within the semiconductor substrate 20. Quenching resistors 7 are connected in series to the respective avalanche photodiodes APDs. The region in which the plurality of avalanche photodiodes APDs are formed is surrounded by a peripheral wiring WL. A light shielding layer SL or the like formed of metal or the like may be provided at the outer side of the peripheral wiring WL. The outer shape of the peripheral wiring WL is a rectangular ring form, and each side thereof is extended along the X-axis or the Y-axis, to be connected to an electrode pad P extended along the X-axis. A plurality of relay wirings 8 are electrically connected to the peripheral wiring WL. The plurality of relay wirings 8 are respectively extended along the Y-axis, to respectively connect at least two places (sites located at the both ends along the Y-axis) of the peripheral wiring WL.

A resistance value per unit length of the peripheral wiring WL is smaller than a resistance value per unit length of the relay wiring 8. That is, in the case where the peripheral wiring WL and the relay wirings 8 are formed of the same conductive material (example: aluminum), and the peripheral wiring WL is extended along the Y-axis, the area of the X-Z cross section thereof is greater than the area of the X-Z cross section of the relay wiring 8. Further, in the case where the peripheral wiring WL is extended along the X-axis, the area of the X-Z cross section thereof is greater than the area of the X-Z cross section of the relay wiring 8. In addition, FIG. 8 is a plan view of the wirings. In the case where the peripheral wiring WL and the relay wiring 8 are the same in thickness, a width W1 of the peripheral wiring WL is wider than a width W2 of the relay wiring 8.

One of an anode and a cathode of each avalanche photodiode APD is electrically connected to any one of the relay wirings 8 via the quenching resistor 7, and the other of the anode and the cathode of each avalanche photodiode APD is electrically connected to another electrode 6 (refer to FIG. 3: a back surface electrode in this example) provided on the semiconductor substrate 20. In addition, the other electrode 6, which may be configured to be electrically connected to the other of an anode and a cathode, may be provided on the surface side of the semiconductor substrate 20.

As described above, in the case where the photodiode array 10 includes the peripheral wiring WL, an electric current from the avalanche photodiode APD passes in the peripheral wiring WL, so as to flow in a larger amount in a closer place (a place having lower resistance in a signal transmission path up to the electrode pad P) of the relay wiring 8 and places of connection (two places in this example) between the relay wiring 8 and the peripheral wiring WL, to flow into the electrode pad P, to be taken out to the outside. In this way, in the case where the peripheral wiring WL is included, it is possible to decrease a resistance value in the signal readout path, and the time constant is decreased, thus the temporal resolution of the photodiode array is improved.

For example, an electric current from the avalanche photodiode APD located at the lower left in FIG. 1 flows in the negative direction of the Y-axis in the relay wiring 8, to thereafter flow into a connecting point Q1 with the peripheral wiring WL as a bypass pathway. Thereafter, the electric current travels in the negative direction of the X-axis in the peripheral wiring WL, to thereafter travel along the positive direction of the Y-axis, and further travels along the positive direction of the X-axis, to flow in a larger amount in the path leading to the electrode pad P.

Further, an electric current from the avalanche photodiode APD located at the upper left in FIG. 1 flows in the positive direction of the Y-axis in the relay wiring 8, to thereafter flow into a connecting point Q2 with the peripheral wiring WL as a bypass pathway. Thereafter, the electric current travels in the positive direction of the X-axis in the peripheral wiring WL, to flow in a larger amount in the path leading to the electrode pad P. In addition, the relay wiring 8 is connected at the two places of the peripheral wiring WL. However, this may have three or more connecting points. For example, in the case where the shape of the relay wiring 8 is a cross shape, it is possible for the relay wiring 8 to be connected at four places to the peripheral wiring WL. When the shape of the relay wiring 8 is radially extended, folded, or branched, the places of connection may be three or more.

In the above-described photodiode array 10, a plurality of the avalanche photodiodes APDs are disposed on the both sides of one of the relay wirings 8, and the respective avalanche photodiodes APDs are connected to the relay wiring 8 via the quenching resistors 7. Hereinafter, the surrounding structure of the avalanche photodiodes APDs will be described in detail.

Figure 2:
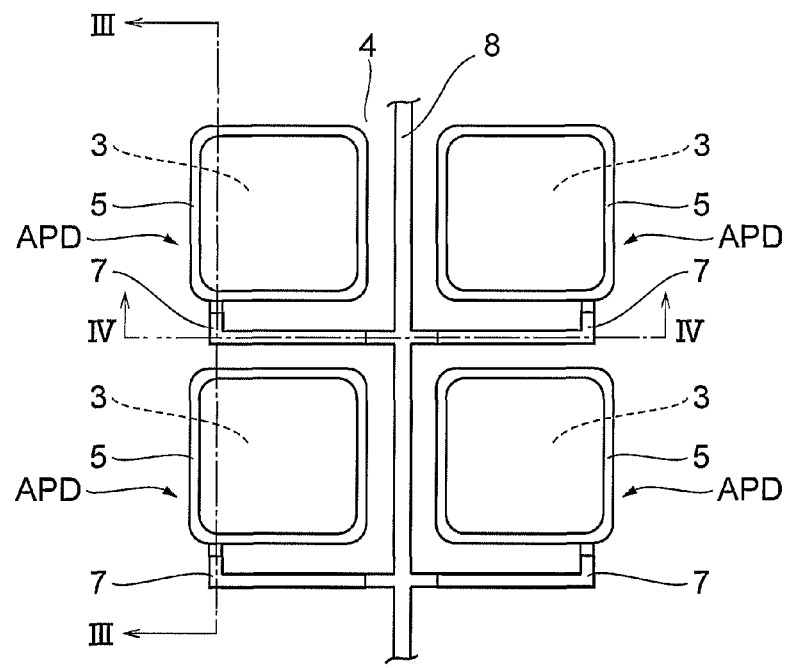
FIG. 2 is an enlarged plan view of a photodiode array.
Figure 3:
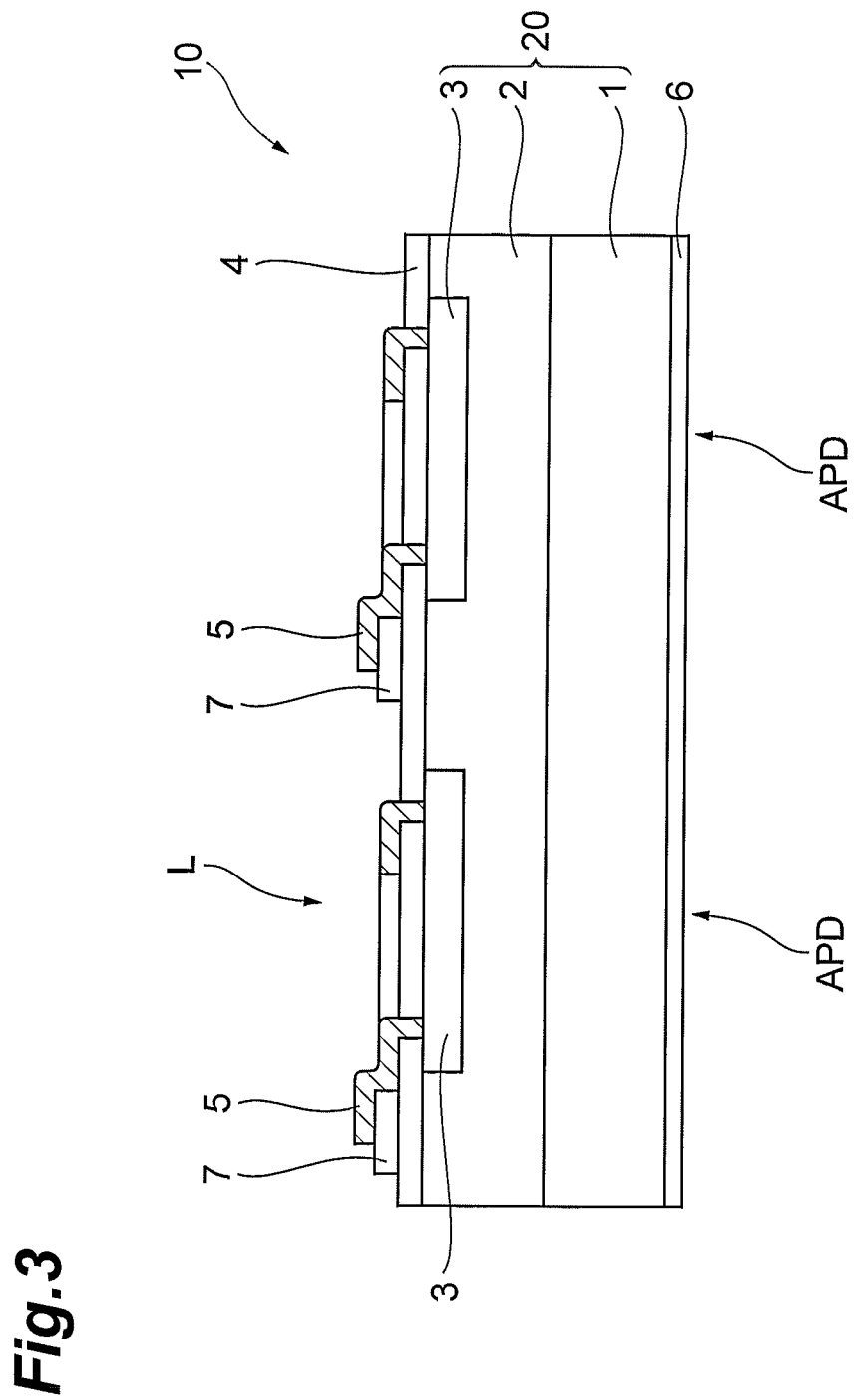
FIG. 3 is a cross sectional view taken along an arrow line of III to III of the photodiode array shown in FIG. 2.
Figure 4:
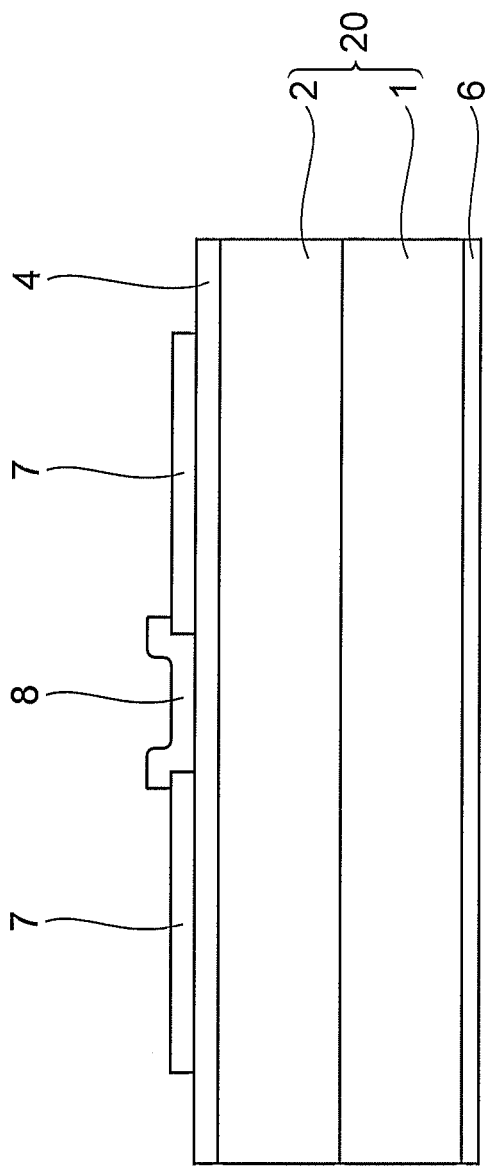
FIG. 4 is a cross sectional view taken along an arrow line of IV to IV of the photodiode array shown in FIG. 2.

FIG. 2 is an enlarged plan view of a first type photodiode array, FIG. 3 is a cross sectional view taken along an arrow line of III to III of the photodiode array shown in FIG. 2, and FIG. 4 is a cross sectional view taken along an arrow line of IV to IV of the photodiode array shown in FIG. 2.

In this photodiode array, the semiconductor substrate 20 includes a first semiconductor layer 1, a second semiconductor layer 2 formed on the first semiconductor layer 1, and a third semiconductor layer 3 formed in the second semiconductor layer 2. The conductivity types of the first semiconductor layer 1, the second semiconductor layer 2, and the third semiconductor layer 3 are respectively the first conductivity type (n-type), the second conductivity type (p-type), and the second conductivity type (p-type). In this case, p-n junctions are formed between the first semiconductor layer 1 and the second semiconductor layer 2, and carriers generated in the depletion layers stretching from the p-n junctions immediately beneath respective ring-shaped electrodes 5 are collected in the respective ring-shaped electrodes 5 via the third semiconductor layer 3. Reverse biases are applied to the avalanche photodiodes APDs composed of the p-n junctions. In addition, in the depletion layers, carriers are generated according to an incidence of light L. From the standpoint of obtaining a favorable crystalline semiconductor layer, the second semiconductor layer 2 is preferably formed by epitaxial growth onto the surface of the first semiconductor layer (substrate) 1. The third semiconductor layer 3 may be formed by ion implantation or diffusion of impurities into the second semiconductor layer 2.

In addition, the impurity concentration of the third semiconductor layer 3 is higher than the impurity concentration of the second semiconductor layer 2. The semiconductor substrate 20 is preferably composed of Si, and pentavalent antimony may be used as n-type impurities, and trivalent boron may be used as p-type impurities.

Further, the dimensions (optimum ranges) of the ring-shaped electrode 5 are as follows.
Line width=3 μm (2 to 5 μm)
Dimension in X-axis direction: 50 μm (10 to 100 μm)
Dimension in Y-axis direction: 50 μm (10 to 100 μm)
Opening area=2500 μm$^2$ (100 μm$^2$ to 10000 μm$^2$)

Further, in the photodiode arrays of the respective types in the detailed description, the conductivity types of the first semiconductor layer 1, the second semiconductor layer 2, and the third semiconductor layer 3 may be respectively the first conductivity type (n-type), the first conductivity type (n-type), and the second conductivity type (p-type). In this case, p-n junctions are formed between the second semiconductor layer 2 and the third semiconductor layer 3, and carriers generated in the depletion layers stretching from the p-n junctions immediately beneath the respective ring-shaped electrodes 5 are collected in the respective ring-shaped electrodes 5 via the third semiconductor layer 3. Reverse biases are applied to the avalanche photodiodes APDs composed of the p-n junctions.

It is a matter of course that, in the description, the first conductivity type may be set to p-type, and the second conductivity type may be set to n-type conversely from the above-description, and in this case, the direction in which biases are applied is opposite to the above-described direction.

An insulating layer 4 formed of SiO$_2$ is formed on the third semiconductor layer 3, and the ring-shaped electrodes 5 are formed on the insulating layer 4. The ring-shaped electrodes 5 are connected to the third semiconductor layer 3 via openings provided in the insulating layer 4. The planar shape of the ring-shaped electrode 5 is a rectangular ring form, and one end of the ring-shaped electrode 5 is connected to one end of the quenching resistor (layer) 7 via an appropriate conductive layer as needed. The quenching resistor 7 extended along the X-axis is formed of polysilicon, and the ring-shaped electrode 5, the relay wiring 8, and the peripheral wiring are formed of aluminum. The volume resistivity of polysilicon is higher than the volume resistivity of aluminum. The quenching resistor 7 is formed on the insulating layer 4, and the other end of the quenching resistor 7 is electrically connected to the relay wiring 8 extended along the Y-axis.

The other electrode 6 is provided on the back surface of the semiconductor substrate 20. However, in the case where the first semiconductor layer 1 is the n-type, this electrode 6 is a cathode electrode, and the ring-shaped electrodes 5 are anode electrodes, and the regions sandwiched between these electrodes respectively compose the avalanche photodiodes APDs. A reverse bias voltage Vop is applied between the cathode electrode and the anode electrode.

Figure 33:
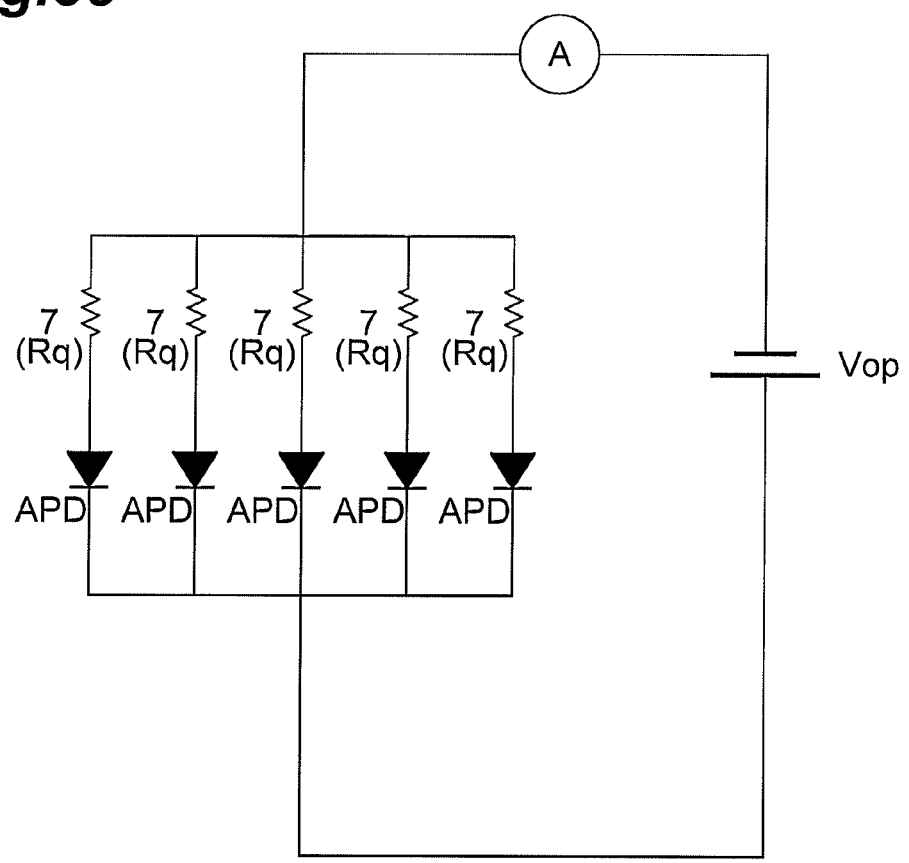
FIG. 33 is a circuit diagram of a photodiode array.

FIG. 33 is a circuit diagram of the photodiode array. The respective avalanche photodiodes APDs composing the photodiode array which are all connected in parallel so as to be respectively connected in series to the quenching resistors 7, and the reverse bias voltage Vop is applied from the electric power supply. The output electric current from the avalanche photodiodes is detected by a detector A including an amplifier and the like.

Figure 34:
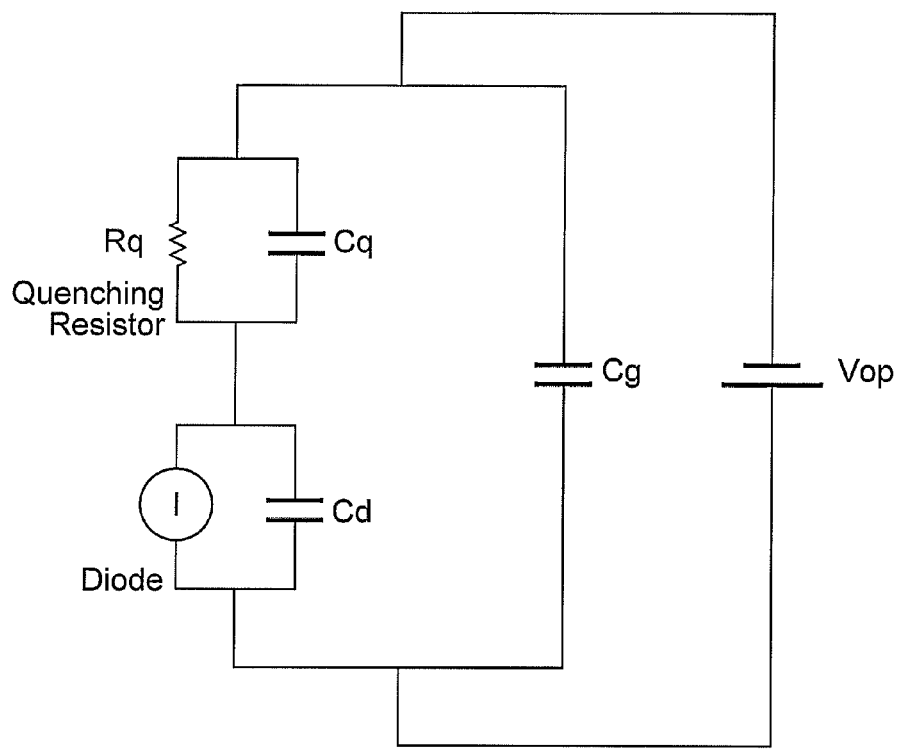
FIG. 34 is a diagram showing an equivalent circuit of a detection section including an avalanche photodiode and a quenching resistor.

FIG. 34 is a diagram showing an equivalent circuit of a detection section including an avalanche photodiode and a quenching resistor. The avalanche photodiode APD is illustrated as one to which an electric power supply I and a capacitor Cd providing a diode capacitance are connected in parallel, the quenching resistor is illustrated as a resistor having a resistance value Rq, to which a capacitor Cq is connected in parallel, and as a whole, a capacitor Cg showing a wiring capacitance is connected in parallel to the electric power supply. Here, because of the existence of the capacitor Cq, the temporal resolution of the photodiode array is improved. Hereinafter, the photodiode array having the capacitors Cq in various modes will be described. That is, the photodiode array in the following mode further includes the quenching resistors Rq which are connected in parallel to the respective avalanche photodiodes APDs, and the capacitors Cq which are respectively connected in parallel to the quenching resistors Rq.

The resistance values Rq (optimum ranges) and the capacitance of the capacitor Cg (optimum ranges) are as follows.

Resistance value Rq=150 kΩ (50 to 300 kΩ)

Capacitance of the capacitor Cg=5 pF (this is a wiring capacitance, and is preferably 0, that is, the lower capacitance, the better)

Figure 25:
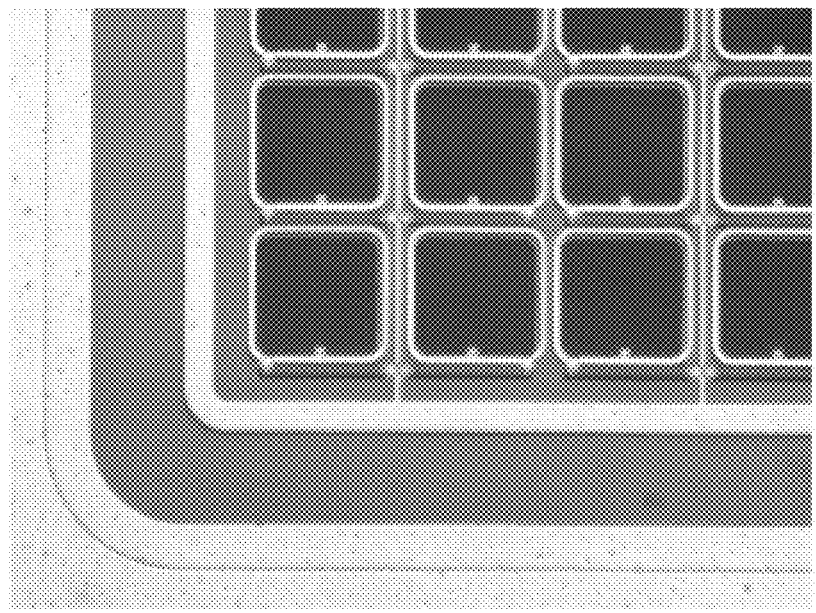
FIG. 25 is a diagram showing a microscope photograph of the photodiode array shown in FIG. 2.

In the above-described case, the temporal resolution is further improved. FIG. 25 is a diagram showing a microscope photograph in the case where the photodiode array shown in FIG. 2 is manufactured.

Figure 5:
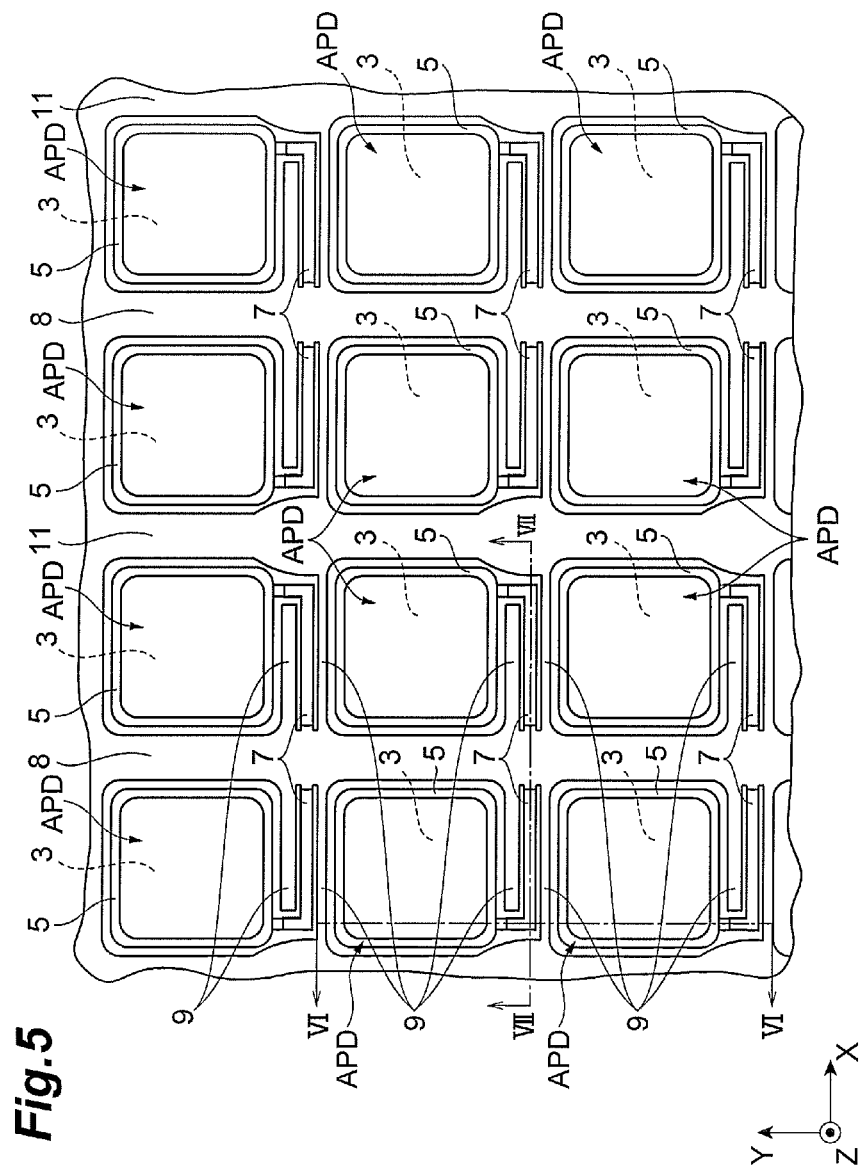
FIG. 5 is an enlarged plan view of a photodiode array.
Figure 6:
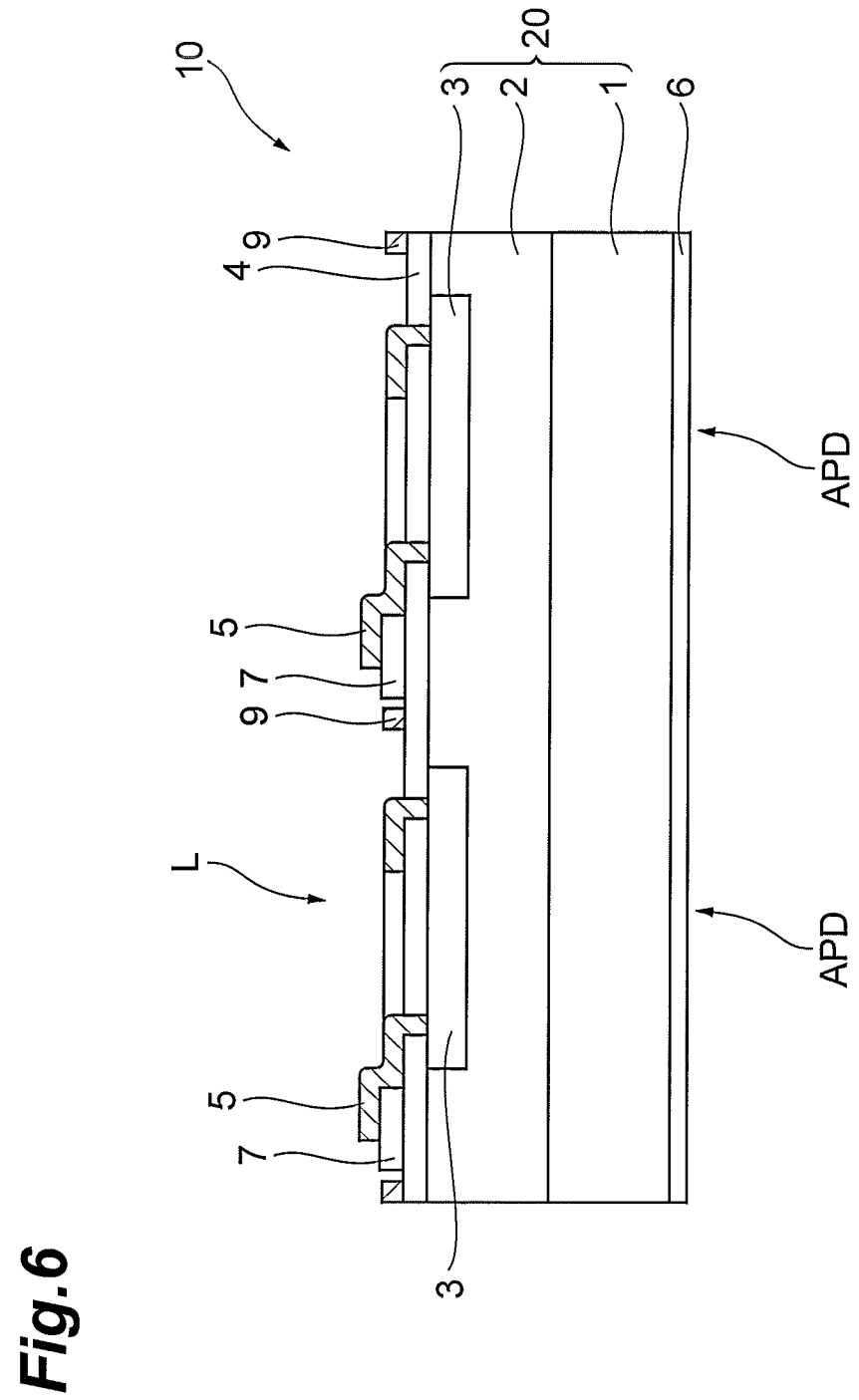
FIG. 6 is a cross sectional view taken along an arrow line of VI to VI of the photodiode array shown in FIG. 5.
Figure 7:
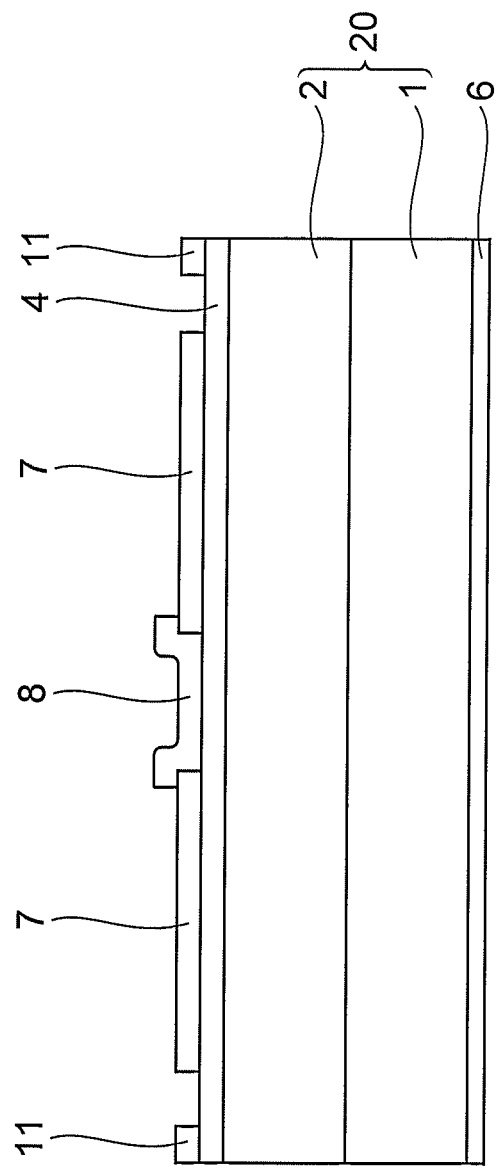
FIG. 7 is a cross sectional view taken along an arrow line of VII to VII of the photodiode array shown in FIG. 5.

FIG. 5 is an enlarged plan view of a photodiode array having the capacitors Cq, FIG. 6 is a cross sectional view taken along an arrow line of VI to VI of the photodiode array shown in FIG. 5, and FIG. 7 is a cross sectional view taken along an arrow line of VII to VII of the photodiode array shown in FIG. 5.

A point of difference between the photodiode array of the present example and the photodiode array shown in FIGS. 2 to 4 is that a peripheral region 9 which is extended so as to surround the ring-shaped electrode 5 is provided around the relay wiring 8, and a part of the peripheral region 9 continues into an intermediate wiring 11, and the width W2 of the relay wiring 8 is thickened, and the other structures are the same. That is, in this photodiode array, either anodes or cathodes of the respective avalanche photodiodes APDs are electrically connected to the ring-shaped electrodes 5, meanwhile, the relay wiring 8 includes the conductive peripheral region 9 which is spaced from the ring-shaped electrode 5, and is extended so as to surround the ring-shaped electrode 5. The peripheral region 9 as well is formed of aluminum. In this case, the above-described capacitor Cq has the peripheral region 9 extended from the relay wiring 8, and the ring-shaped electrode 5, and a capacitance is formed between those. In the case of the capacitor having this structure, it is possible to configure the capacitor in a planar manner, and the temporal resolution is improved. In addition, the width W2 of the relay wiring 8 is 9 μm, and is preferably 2 to 10 μm. In this case, it is possible to sufficiently decrease the resistance value, to inhibit an output difference between pixels.

In addition, the intermediate wirings 11 which are extended parallel to the relay wirings 8 are provided between the adjacent relay wirings 8. The both ends of the intermediate wirings 11 are connected to two places of the peripheral wiring WL. It is a matter of course that this may be configured such that the intermediate wiring 11 is connected to three or more places of the peripheral wiring WL. In addition, in the case where transverse wirings which will be described later are used, one ends of the relay wirings 8 and the intermediate wirings 11 are connected to the transverse wirings. At the region outside the inside of the opening of the ring-shaped electrode 5, an incident light is shielded by the relay wiring 8, the intermediate wiring 11, and the peripheral wiring WL. Meanwhile, because of the high reflectance of aluminum, it is possible to return the light to a scintillator which will be described later. In addition, a part of the peripheral region 9 extended from the relay wirings 8 continues into the intermediate wiring 11, and the other part of the peripheral region 9 is extended so as to be located between the quenching resistor 7 and the ring-shaped electrode 5.

Figure 26:
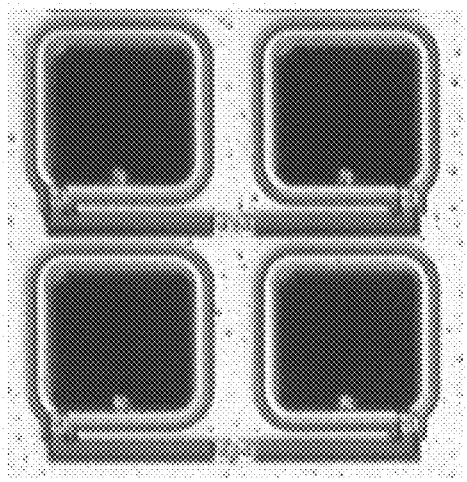
FIG. 26 is a diagram showing a microscope photograph of the photodiode array shown in FIG. 5.

FIG. 26 is a diagram showing a microscope photograph of the photodiode array shown in FIG. 5. In this case, it is confirmed that it is possible to configure the capacitor in a planar manner, and the temporal resolution is improved.

Figure 9:
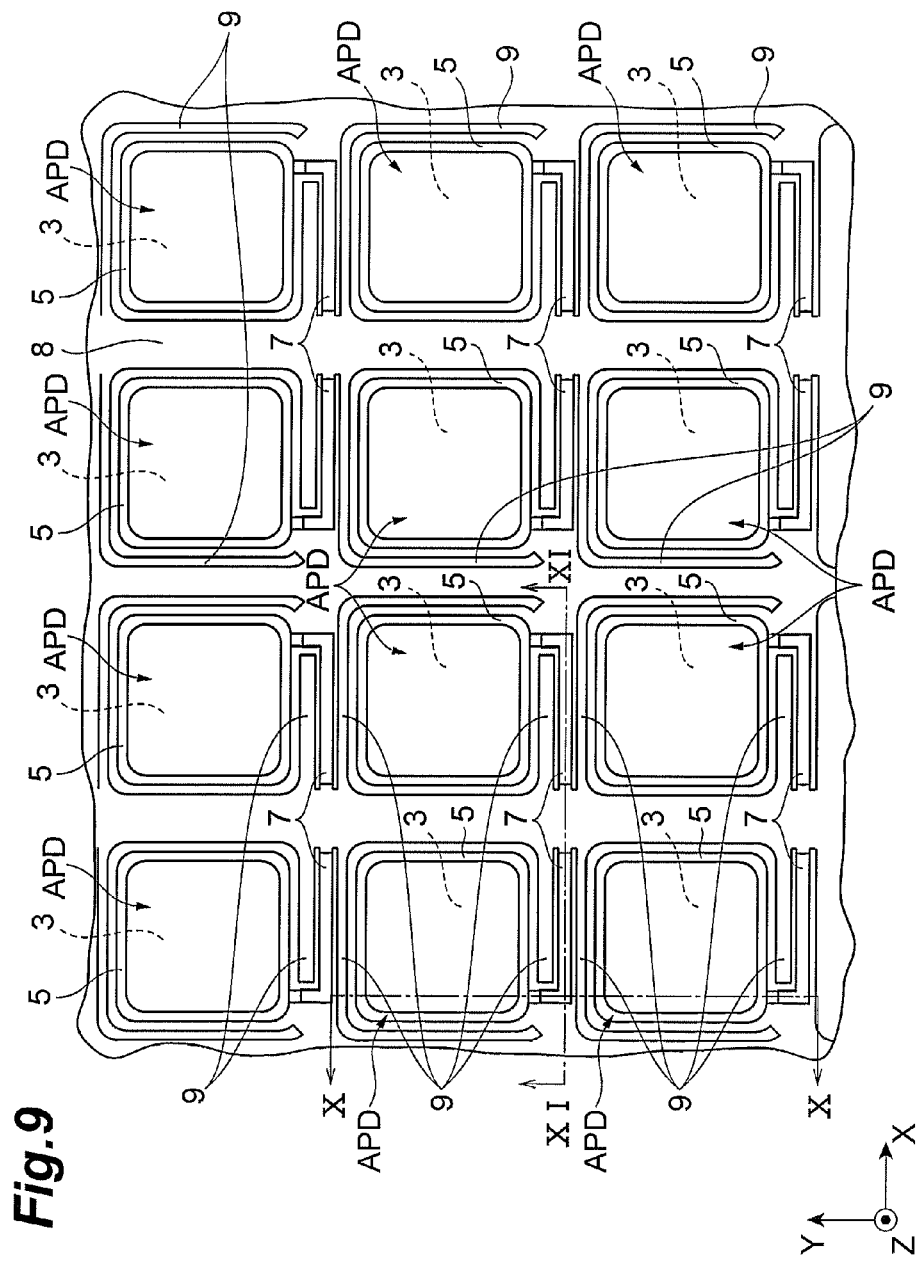
FIG. 9 is an enlarged plan view of a photodiode array.
Figure 10:
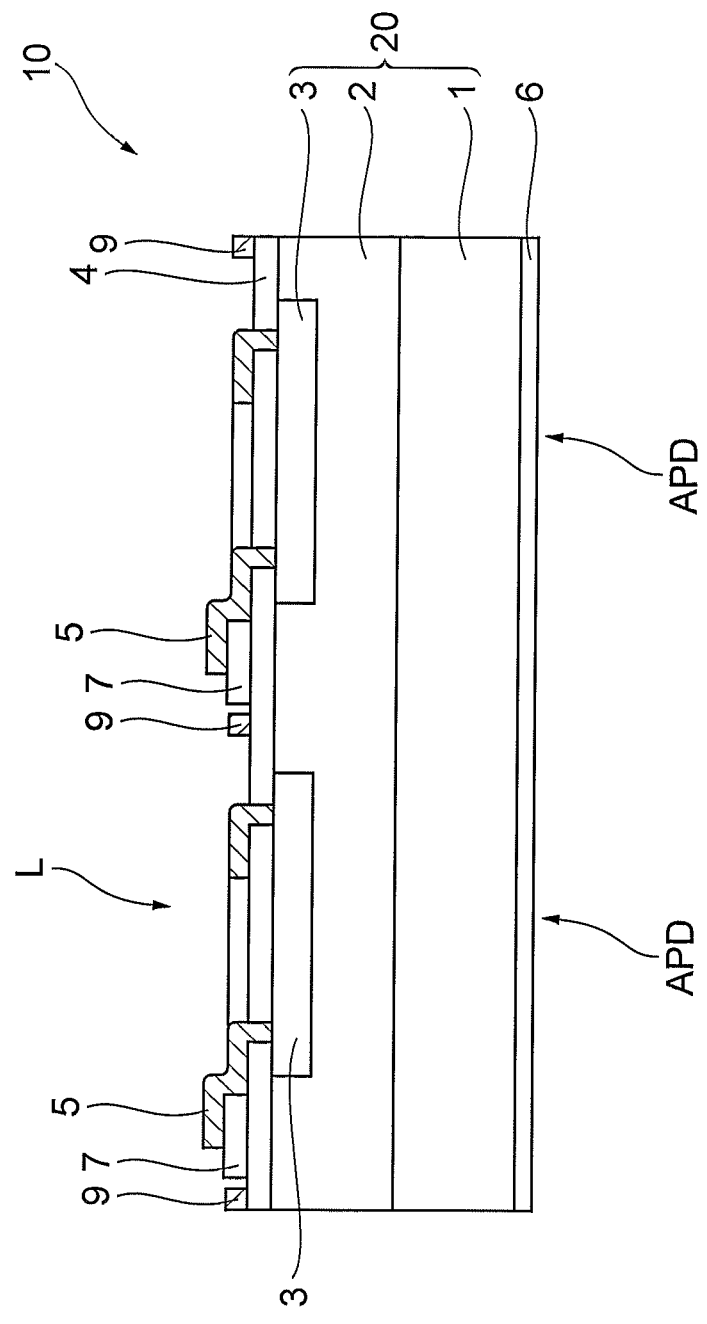
FIG. 10 is a cross sectional view taken along an arrow line of X to X of the photodiode array shown in FIG. 9.
Figure 11:
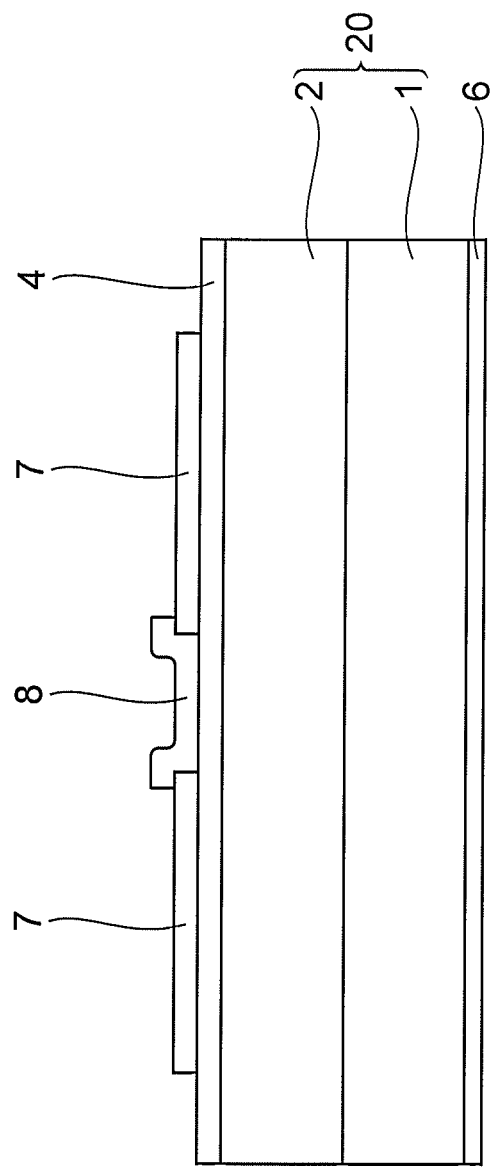
FIG. 11 is a cross sectional view taken along an arrow line of XI to XI of the photodiode array shown in FIG. 9.

FIG. 9 is an enlarged plan view of another photodiode array having the capacitors Cq, FIG. 10 is a cross sectional view taken along an arrow line of X to X of the photodiode array shown in FIG. 9, and FIG. 11 is a cross sectional view taken along an arrow line of XI to XI of the photodiode array shown in FIG. 9.

A point of difference between the photodiode array of the present example and the photodiode array shown in FIGS. 5 to 7 is that the peripheral region 9 is connected to the both sides of the relay wiring 8, but there is no intermediate wiring 11, and the peripheral regions 9 adjacent to one another are spaced from the relay wirings 8 adjacent to one another, and the other structures are the same. That is, the peripheral region 9 surrounds the periphery of the ring-shaped electrode 5, but there is no intermediate wiring 11, and the leading end portion of the peripheral region 9 is spaced from the adjacent peripheral region 9. Thereby, it is possible to lower the wiring capacitance lower than that of the photodiode array shown in FIGS. 5 to 7. The capacitor Cq is formed between the peripheral region 9 and the ring-shaped electrode 5.

Figure 27:
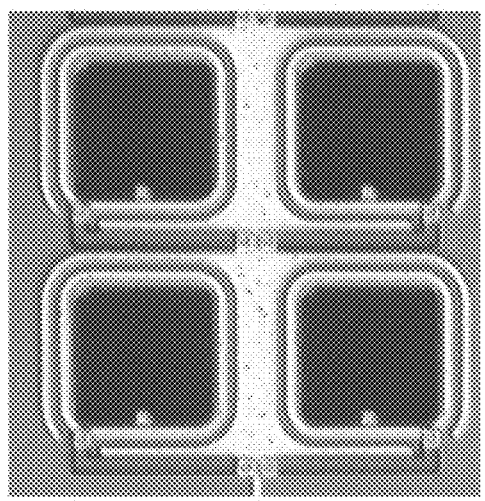
FIG. 27 is a diagram showing a microscope photograph of the photodiode array shown in FIG. 9.

FIG. 27 is a diagram showing a microscope photograph of the photodiode array shown in FIG. 9. In this case as well, it is confirmed that it is possible to configure the capacitor in a planar manner, and the temporal resolution is improved.

Figure 12:
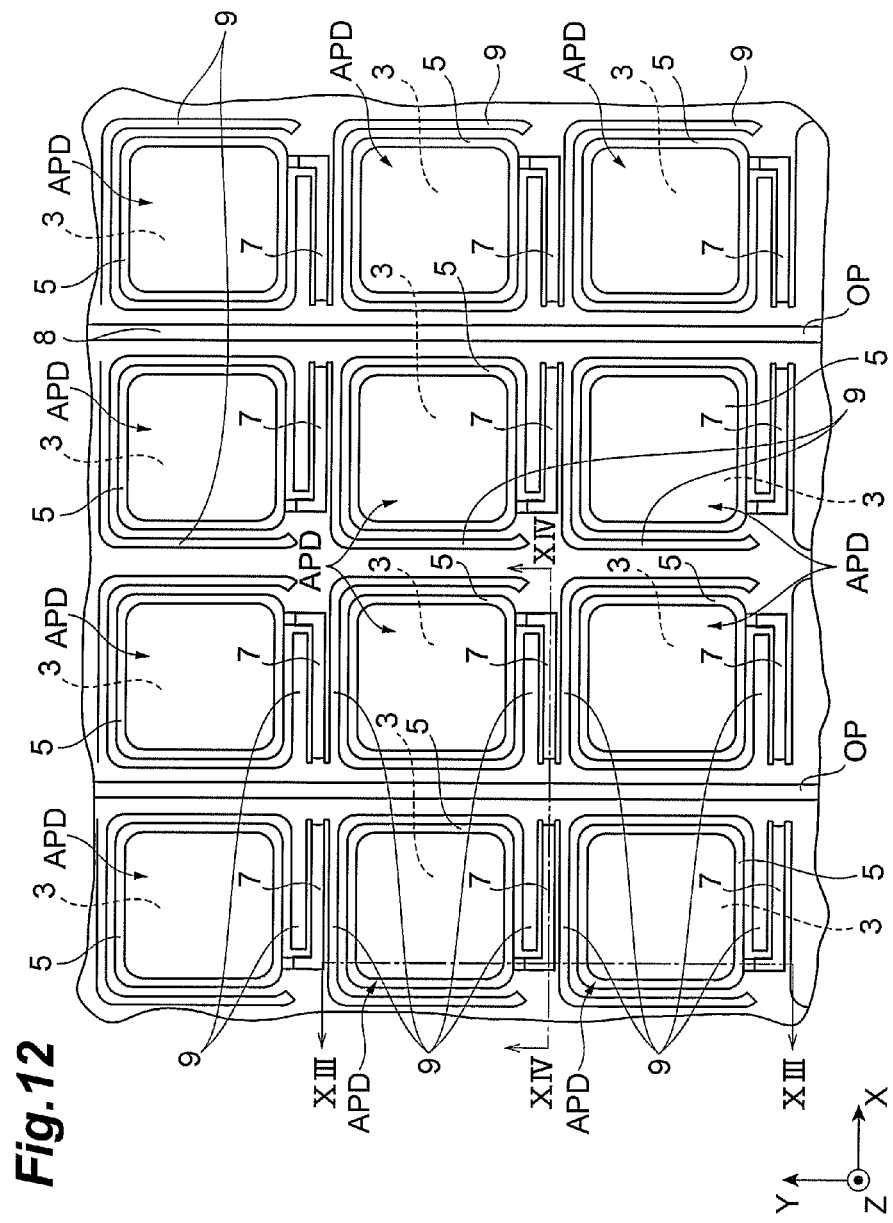
FIG. 12 is an enlarged plan view of a photodiode array.
Figure 13:
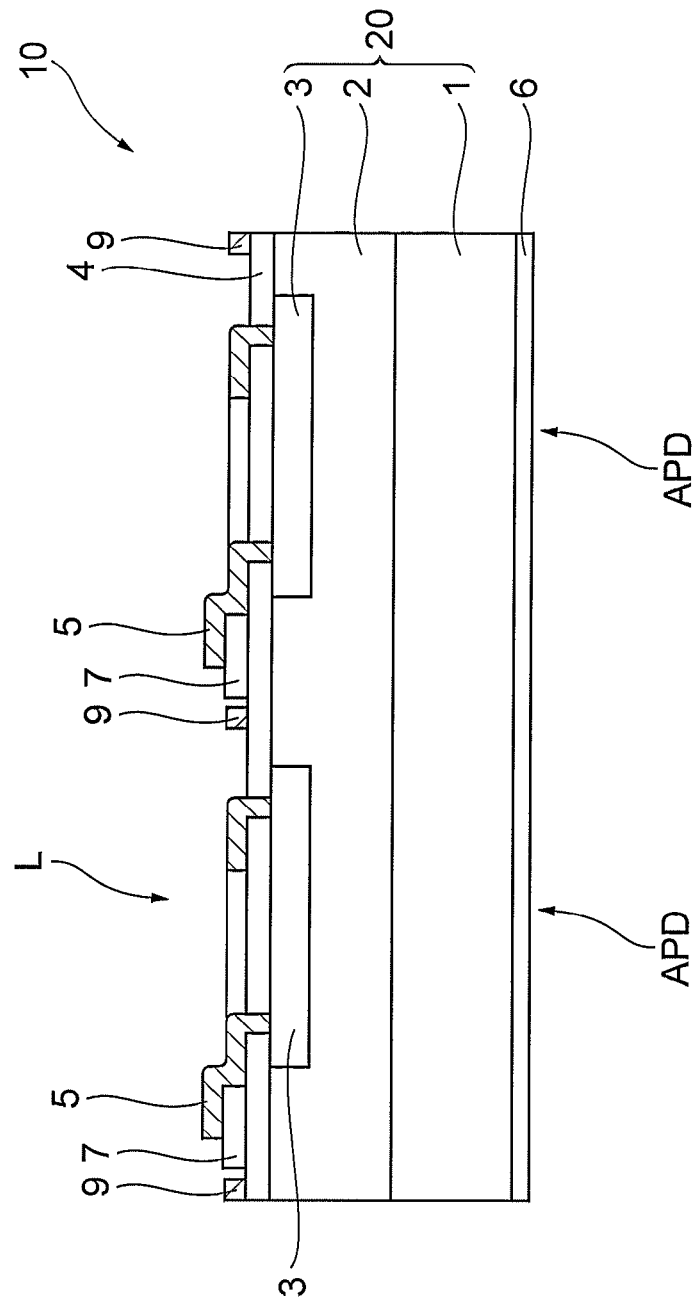
FIG. 13 is a cross sectional view taken along an arrow line of XIII to XIII of the photodiode array shown in FIG. 12.
Figure 14:
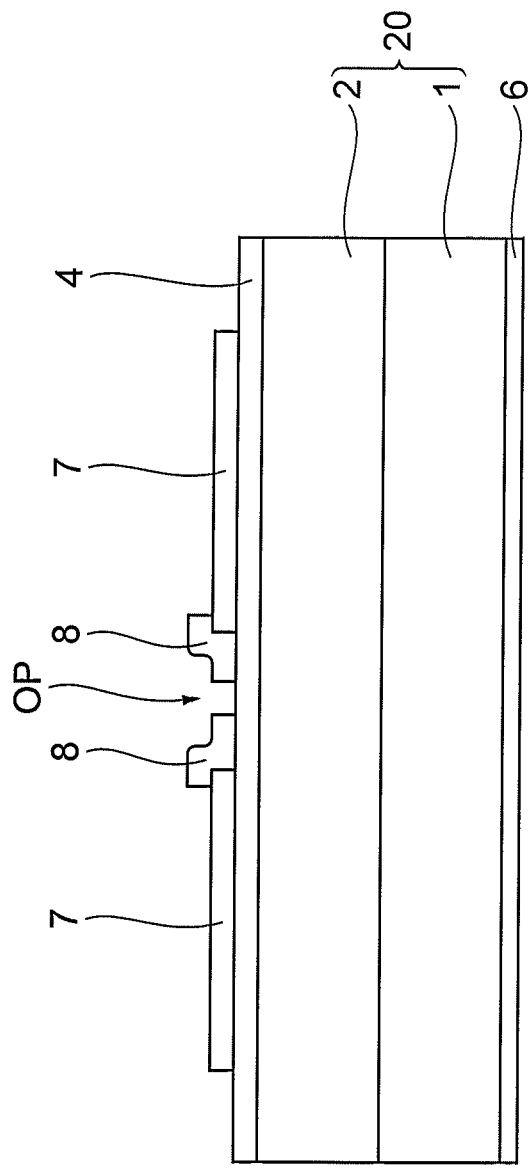
FIG. 14 is a cross sectional view taken along an arrow line of XIV to XIV of the photodiode array shown in FIG. 12.

FIG. 12 is an enlarged plan view of yet another photodiode array having the capacitors Cq, FIG. 13 is a cross sectional view taken along an arrow line of XIII to XIII of the photodiode array shown in FIG. 12, and FIG. 14 is a cross sectional view taken along an arrow line of XIV to XIV of the photodiode array shown in FIG. 12.

A point of difference between the photodiode array of the present example and the photodiode array shown in FIGS. 9 to 11 is that the respective relay wirings 8 have openings OP at the regions along the center lines (the Y-axis) thereof, and the other structures are the same. In this case, in addition to the above-described effect, it is possible to lower the wiring capacitance by the relay wiring 8, and it is possible to further improve the temporal resolution. The width in the X-axis direction of the opening OP is 5 μm, and is preferably 2 to 5 μm from the standpoint of further improving the temporal resolution. This opening structure can be applied to another structure including the relay wirings 8.

Figure 28:
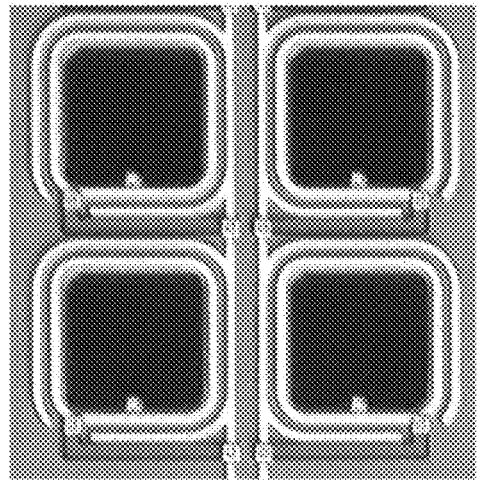
FIG. 28 is a diagram showing a microscope photograph of the photodiode array shown in FIG. 12.

FIG. 28 is a diagram showing a microscope photograph of the photodiode array shown in FIG. 12. In this case as well, it is confirmed that it is possible to configure the capacitor in a planar manner, and the temporal resolution is improved.

Figure 15:
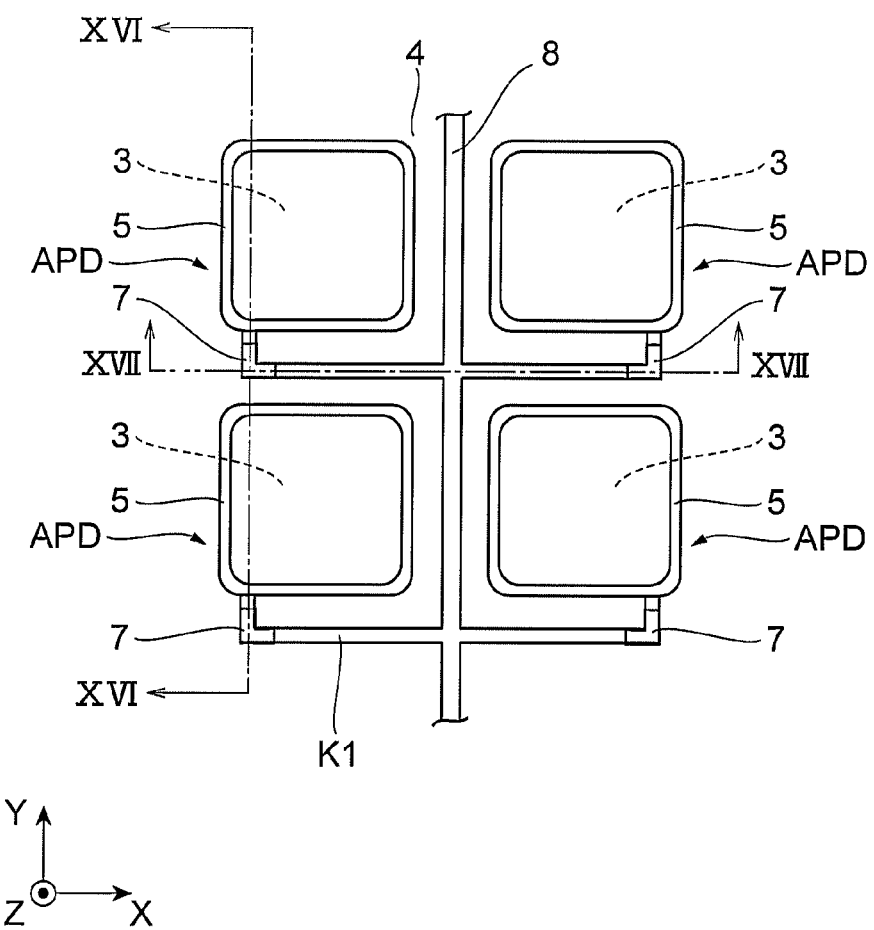
FIG. 15 is an enlarged plan view of a photodiode array.
Figure 16:
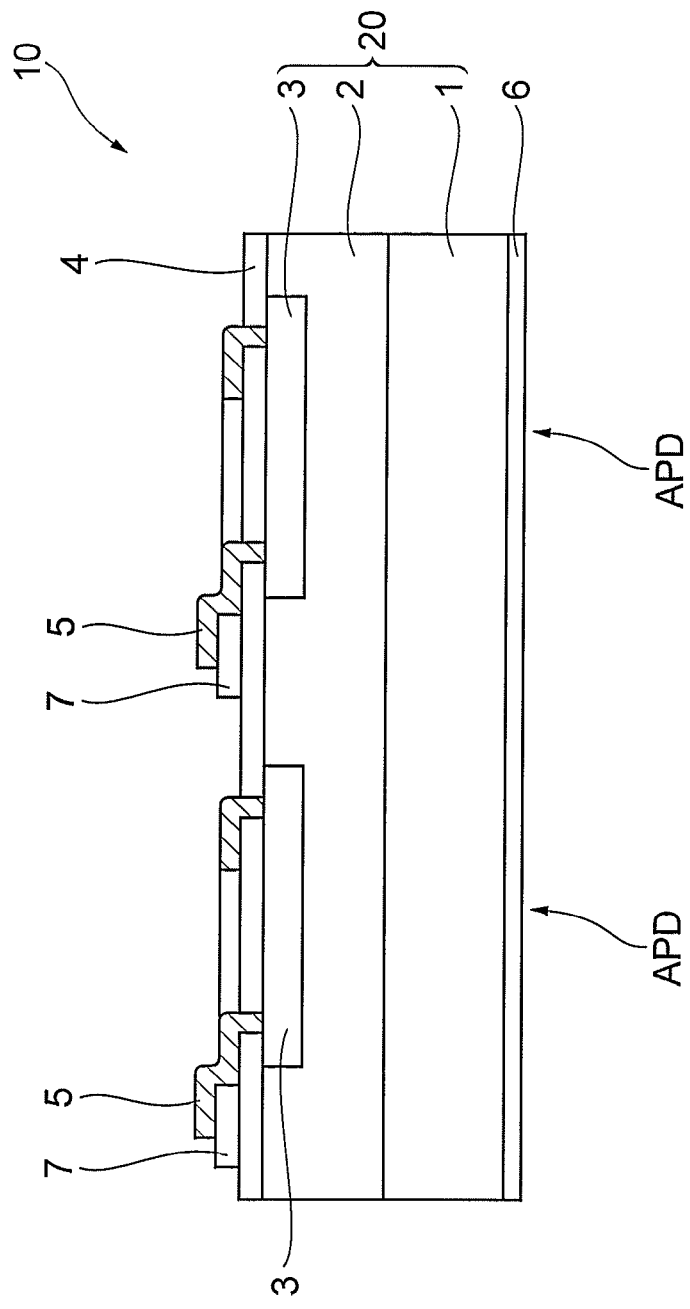
FIG. 16 is a cross sectional view taken along an arrow line of XVI to XVI of the photodiode array shown in FIG. 15.
Figure 17:
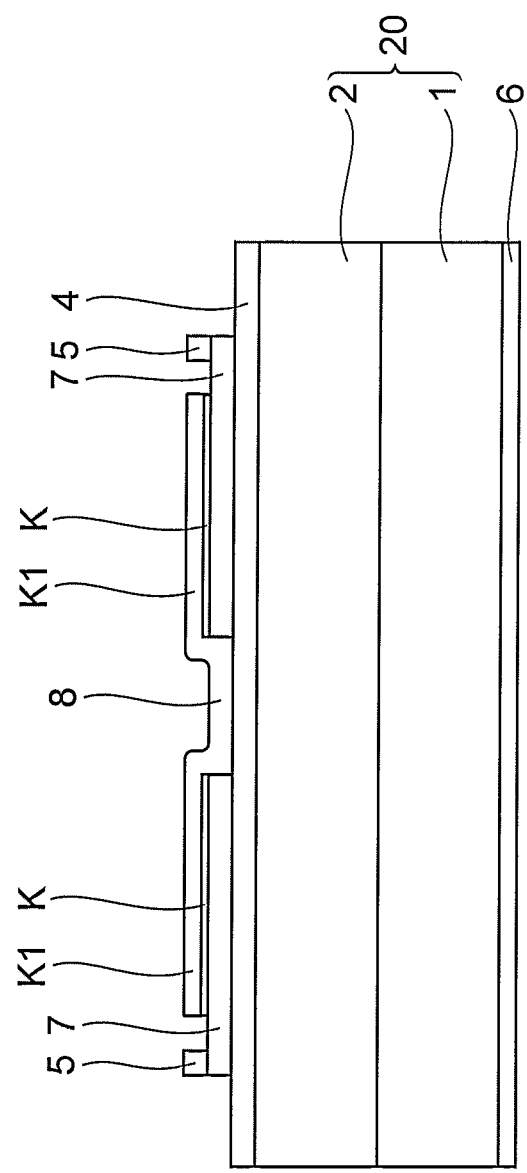
FIG. 17 is a cross sectional view taken along an arrow line of XVII to XVII of the photodiode array shown in FIG. 15.

FIG. 15 is an enlarged plan view of yet another photodiode array having the capacitors Cq, FIG. 16 is a cross sectional view taken along an arrow line of XVI to XVI of the photodiode array shown in FIG. 15, and FIG. 17 is a cross sectional view taken along an arrow line of XVII to XVII of the photodiode array shown in FIG. 15.

A point of difference between the photodiode array of the present example and the photodiode array shown in FIGS. 2 to 5 is that the capacitor Cq has a covering wiring K1 formed on the quenching resistor 7 via an insulating layer K of SiN, $SiO_2$, or the like, and one end of the covering wiring K1 is electrically connected to one end of the quenching resistor 7, and the other structures are the same. In this example, the covering wiring K1 is extended from the relay wirings 8, to cover the insulating layer K. A capacitance is formed between the covering wiring K1 and the quenching resistors 7.

Figure 29:
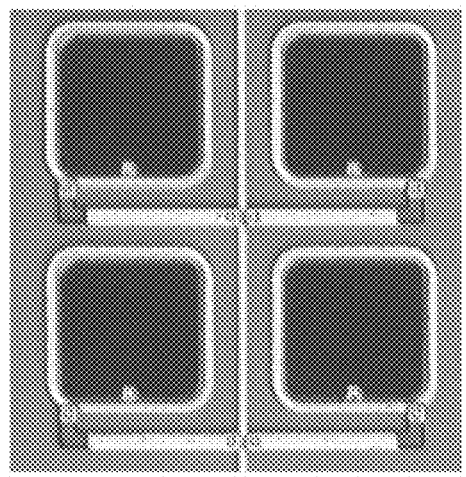
FIG. 29 is a diagram showing a microscope photograph of the photodiode array shown in FIG. 15.

FIG. 29 is a diagram showing a microscope photograph of the photodiode array shown in FIG. 15. In this case as well, it is confirmed that it is possible to sterically configure the capacitor due to its lamination, thus it is possible to improve the element density, and the temporal resolution is improved.

Figure 18:
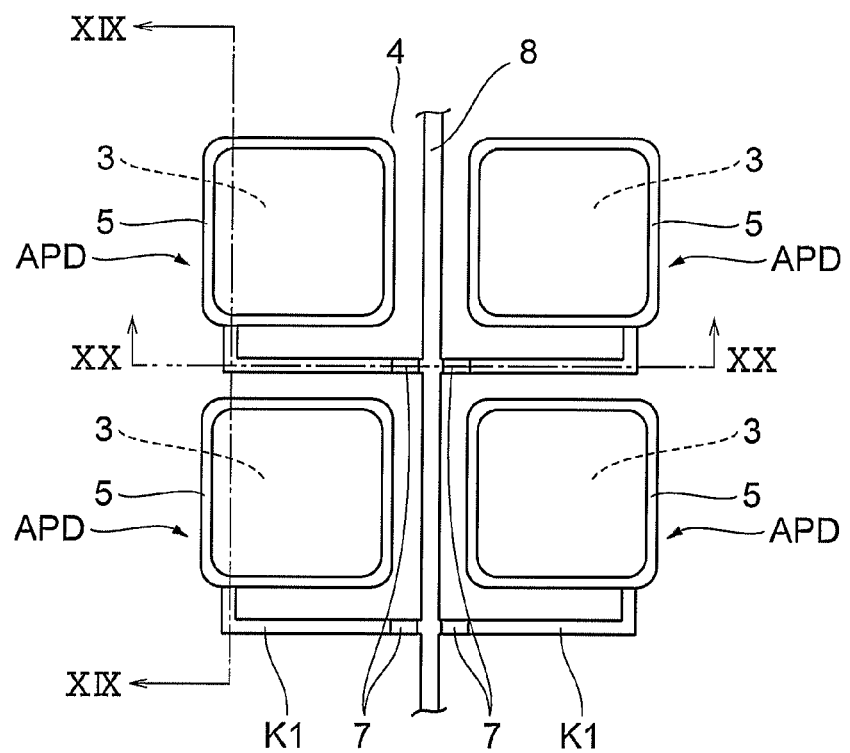
FIG. 18 is an enlarged plan view of a photodiode array.
Figure 19:
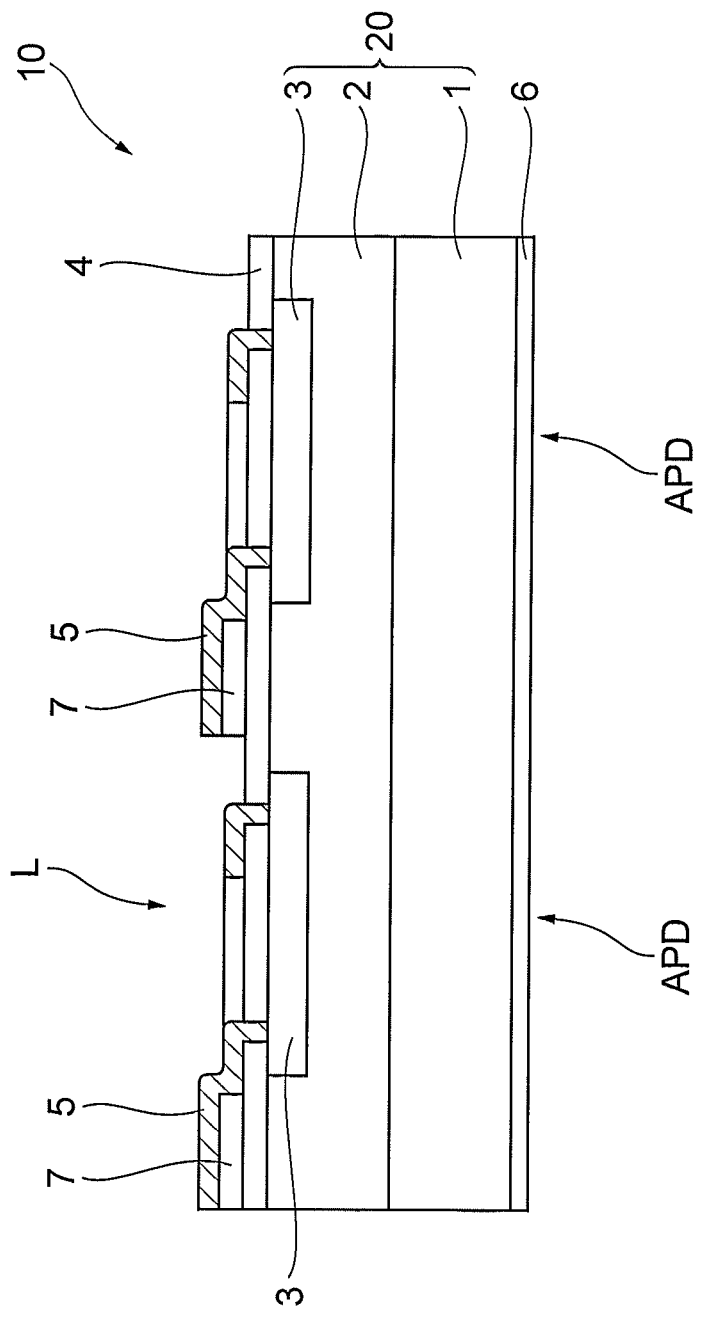
FIG. 19 is a cross sectional view taken along an arrow line of XIX to XIX of the photodiode array shown in FIG. 18.
Figure 20:
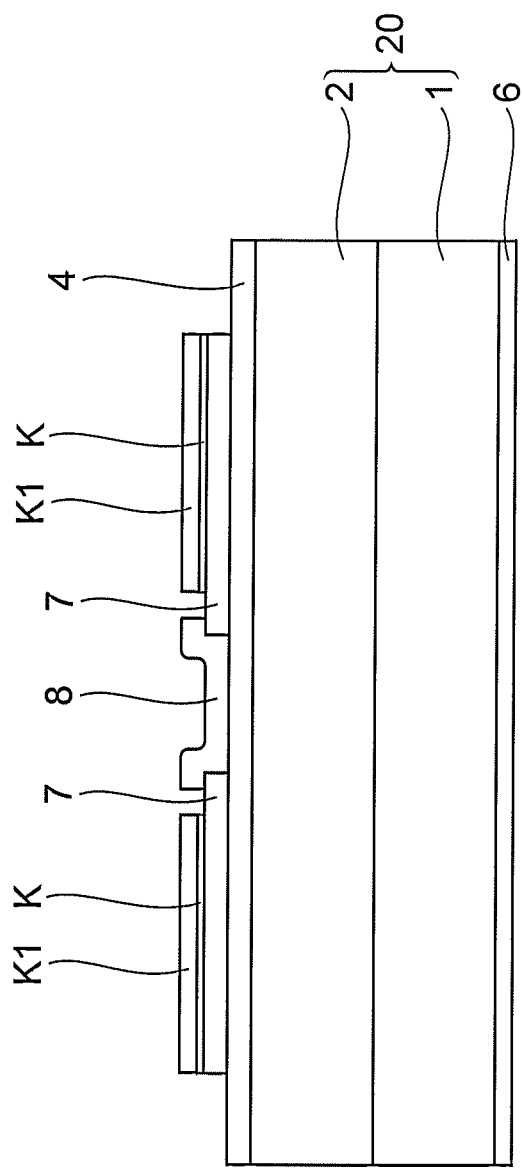
FIG. 20 is a cross sectional view taken along an arrow line of XX to XX of the photodiode array shown in FIG. 18.

FIG. 18 is an enlarged plan view of yet another photodiode array having the capacitors Cq, FIG. 19 is a cross sectional view taken along an arrow line of XIX to XIX of the photodiode array shown in FIG. 18, and FIG. 20 is a cross sectional view taken along an arrow line of XX to XX of the photodiode array shown in FIG. 18.

A point of difference between the photodiode array of the present example and the photodiode array shown in FIGS. 15 to 17 is that the covering wiring K1 is extended from the ring-shaped electrode 5, to cover the insulating layer K, and the other structures are the same. In this case as well, a capacitance is formed between the covering wiring K1 and the quenching resistor 7, to configure the capacitor Cq.

Figure 30:
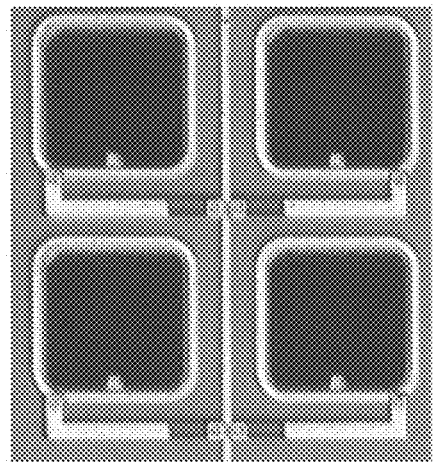
FIG. 30 is a diagram showing a microscope photograph of the photodiode array shown in FIG. 18.

FIG. 30 is a diagram showing a microscope photograph of the photodiode array shown in FIG. 18. In this case as well, it is confirmed that it is possible to sterically configure the capacitor due to its lamination, thus it is possible to improve the element density, and the temporal resolution is improved.

Figure 21:
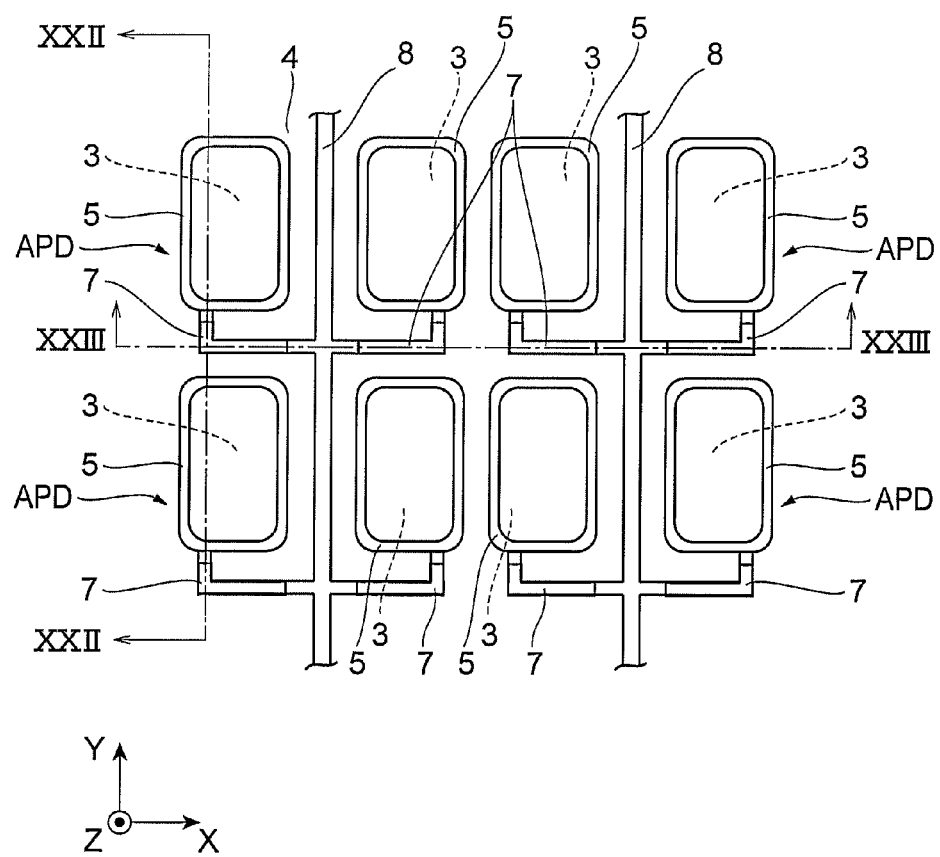
FIG. 21 is an enlarged plan view of a photodiode array.
Figure 22:
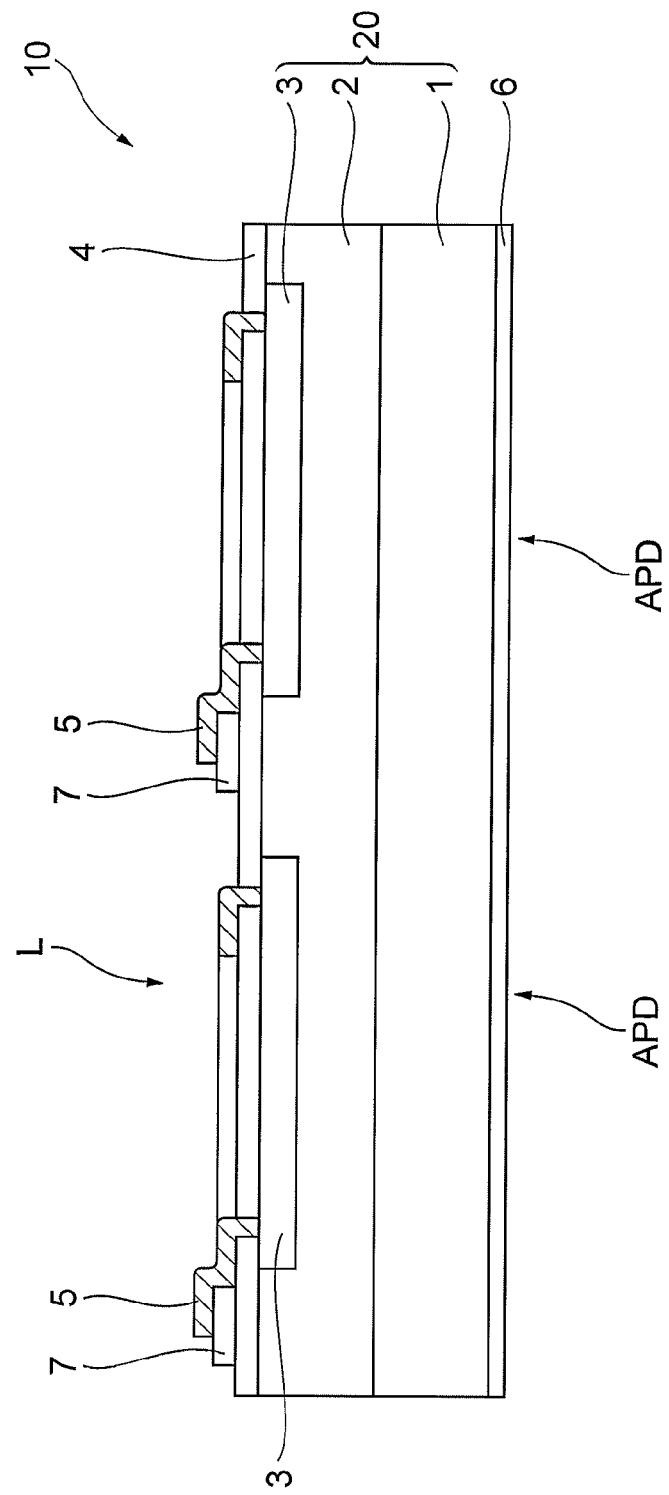
FIG. 22 is a cross sectional view taken along an arrow line of XXII to XXII of the photodiode array shown in FIG. 21.
Figure 23:
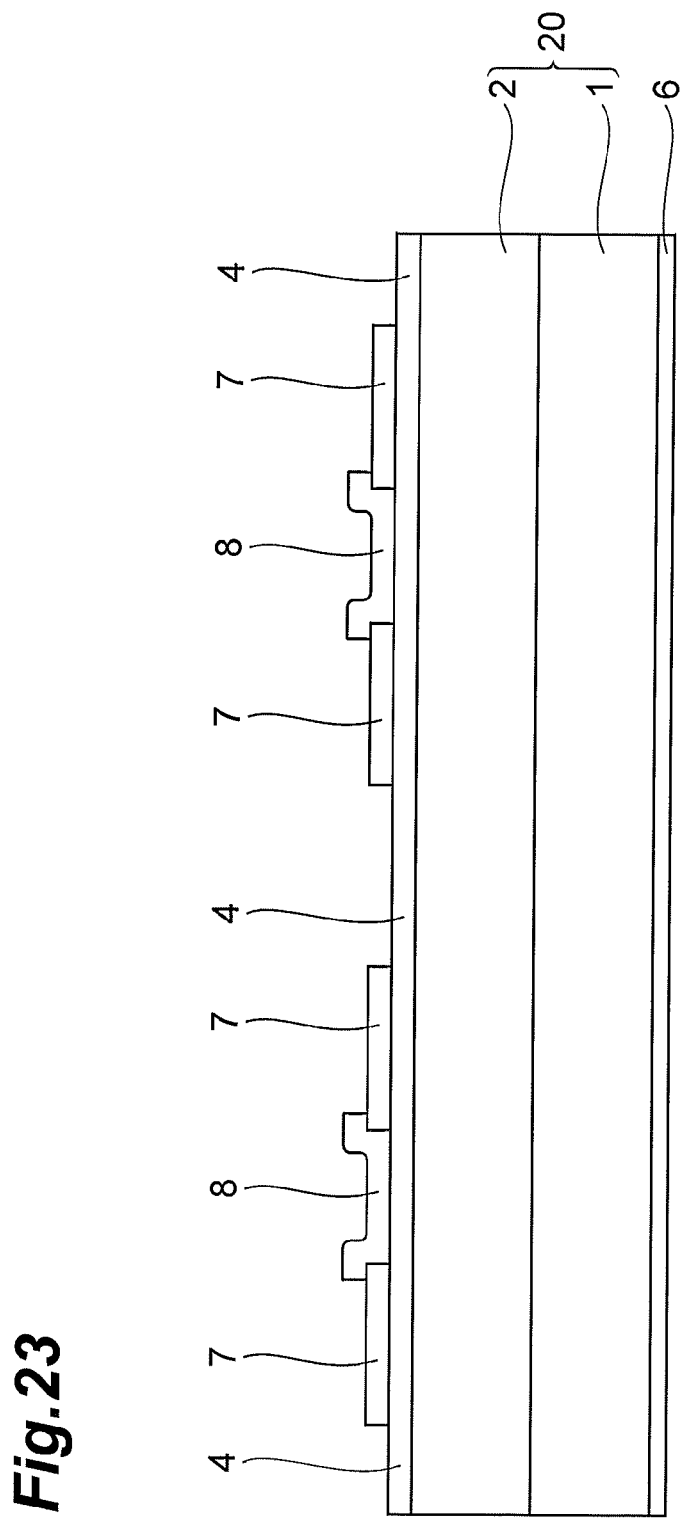
FIG. 23 is a cross sectional view taken along an arrow line of XXIII to XXIII of the photodiode array shown in FIG. 21.

FIG. 21 is an enlarged plan view of yet another photodiode array having the capacitors Cq, FIG. 22 is a cross sectional view taken along an arrow line of XXII to XXII of the photodiode array shown in FIG. 21, and FIG. 23 is a cross sectional view taken along an arrow line of XXIII to XXIII of the photodiode array shown in FIG. 21.

Figure 31:
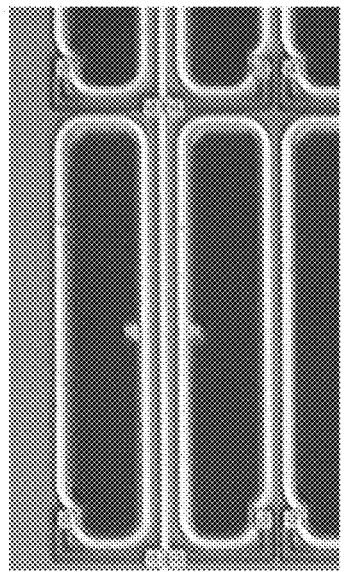
FIG. 31 is a diagram showing a microscope photograph of the photodiode array shown in FIG. 21.

A point of difference between the photodiode array of the present example and the photodiode array shown in FIGS. 2 to 5 is that either anodes or cathodes of the respective avalanche photodiodes APDs are electrically connected to the ring-shaped electrodes 5, and an aspect ratio of the ring-shaped electrode 5 (=dimension in the Y-axis direction/dimension in the X-axis direction) is 2 or more. In this case, the capacitor Cq is configured between the intermediate wiring 8 and the ring-shaped electrode 5 which is spaced from it to run in parallel. However, because of the high aspect ratio, it is possible to increase the capacitance of the capacitor Cq. Accordingly, the proportion of the capacitor with respect to an opening ratio of the ring-shaped electrode 5 is increased, and the element density of the capacitor is increased. Accordingly, it is confirmed that it is possible to improve the space resolution by downsizing the ring-shaped electrode 5, and the temporal resolution is improved. FIG. 31 is a diagram showing a microscope photograph of the photodiode array shown in FIG. 21.

In addition, the structure in which the aspect ratio is improved of the present example may be applied to a structure of another type.

Figure 24:
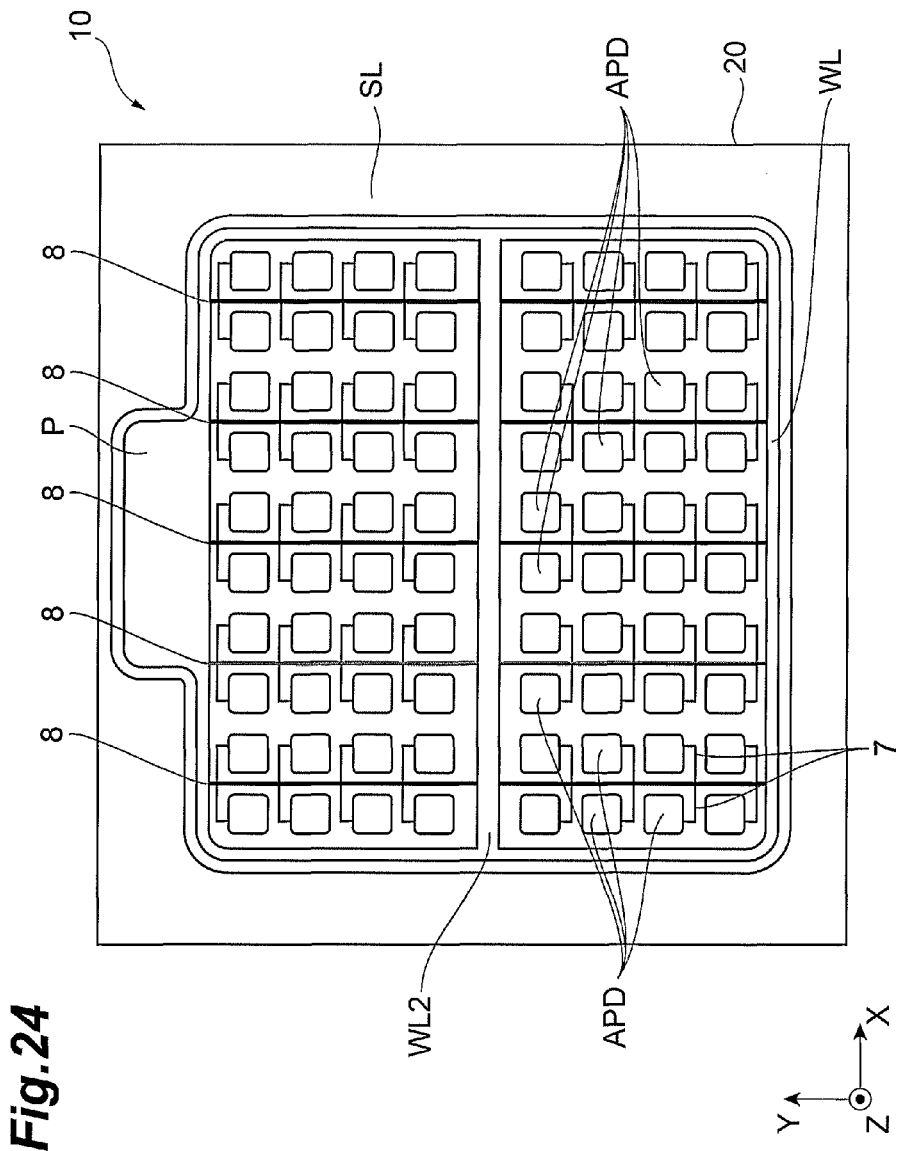
FIG. 24 is a plan view of a photodiode array.

FIG. 24 is a plan view of a photodiode array.

In this photodiode array 10, a transverse wiring WL2 is added to the photodiode array shown in FIG. 1, and the top and the bottom of the group of the avalanche photodiodes, which is located on the upper side from the transverse wiring WL2 in the drawing are turned upside down, and the other structures are the same as that shown in FIG. 1. The transverse wiring WL2 is electrically connected to the peripheral wiring WL, to connect at least two places of the peripheral wiring WL. In this example, the transverse wiring WL2 is extended along the X-axis, and its width is wider than the width of the relay wiring 8. A resistance value per unit length of the transverse wiring WL2 is smaller than a resistance value per unit length of the relay wiring 8. In the case of this structure, one ends of the respective relay wirings 8 shown in FIG. 1 are electrically connected to the transverse wiring WL2 in place of the peripheral wiring WL, and the width of the transverse wiring WL2 is 20 μm, and is preferably 10 to 30 μm from the standpoint of improving the temporal resolution.

Figure 32:
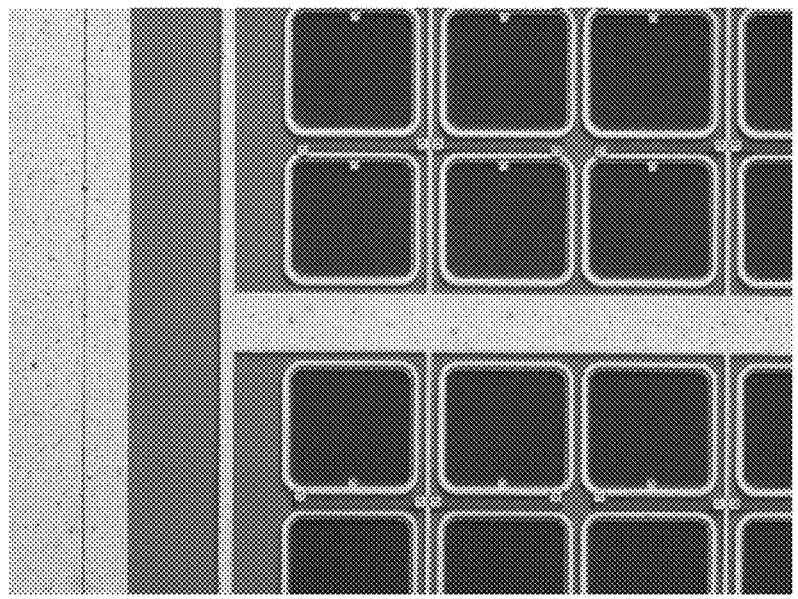
FIG. 32 is a diagram showing a microscope photograph of the photodiode array shown in FIG. 24.

In this case, an electric current from the relay wiring 8 flows in a larger amount in a closer place (a place having lower resistance in a signal transmission path) of a place of connection with the peripheral wiring WL and a place of connection with the transverse wiring WL2, to be taken out to the outside. Therefore, it is possible to further decrease a resistance value in a signal readout path. Accordingly, the temporal constant is decreased, and the temporal resolution is improved. FIG. 32 is a diagram showing a microscope photograph of the photodiode array shown in FIG. 24.

The structure having the peripheral wiring WL shown in FIG. 1 may be applied to the structures shown in FIGS. 3 to 23. Meanwhile, the structure having the transverse wiring WL2 shown in FIG. 24 as well may be applied to the structures shown in FIGS. 3 to 23.

Jitters of output waveforms at 10 mV were measured in the above-described structures. In the case where the structure shown in FIGS. 2 to 4 is adopted in the photodiode array having a peripheral wiring thicker than the relay wiring 8 shown in FIG. 1, the jitter was 146 ps (which is considered as Type 1). On the other hand, in the case where the peripheral wiring WL has a thickness nearly equal to that of the relay wiring 8 (which is considered as a comparison example), the jitter was 160 ps. This reveals that the peripheral wiring is thickened, to reduce a resistance value, thereby decreasing jitter, and the temporal resolution is considerably improved.

In the case where the structure shown in FIGS. 2 to 4 is adopted in the photodiode array having the peripheral wiring shown in FIG. 24, the jitter was 148 ps (which is considered as Type 2). This reveals that the jitter is decreased lower than that in the comparison example, and the temporal resolution is considerably improved.

In the case where the structure shown in FIGS. 5 to 7 is adopted in the photodiode array having the peripheral wiring shown in FIG. 1, the jitter was 142 ps (which is considered as Type 3).

In the case where the structure shown in FIGS. 9 to 11 is adopted in the photodiode array having the peripheral wiring shown in FIG. 1, the jitter was 138 ps (which is considered as Type 4).

In the case where the structure shown in FIGS. 12 to 14 is adopted in the photodiode array having the peripheral wiring shown in FIG. 1, the jitter was 130 ps (which is considered as Type 5).

In the case where the structure shown in FIGS. 15 to 17 is adopted in the photodiode array having the peripheral wiring shown in FIG. 1, the jitter was 125 ps (which is considered as Type 6).

In the case where the structure shown in FIGS. 18 to 20 is adopted in the photodiode array having the peripheral wiring shown in FIG. 1, the jitter was 127 ps (which is considered as Type 7).

In the case where the structure shown in FIGS. 21 to 23 is adopted in the photodiode array having the peripheral wiring shown in FIG. 1, the jitter was 146 ps (which is considered as Type 8).

It is a matter of course that the transverse wiring of Type 2 may be adopted in the structures of Type 3 to Type 8. Further, any one of the structures of Type 3 to Type 5 may be combined with any one of the structures of Type 6 to Type 8. Further, the structure of Type 8 may be combined with a structure of any type. In particular, in the case where the structure of Type 5 (opening structure) or Type 8 (vertically-long structure) is combined with the structure of Type 6 or Type 7 (laminated structure), the above-described effect may produce a synergistic effect, to be able to further reduce the jitter.

Figure 35:
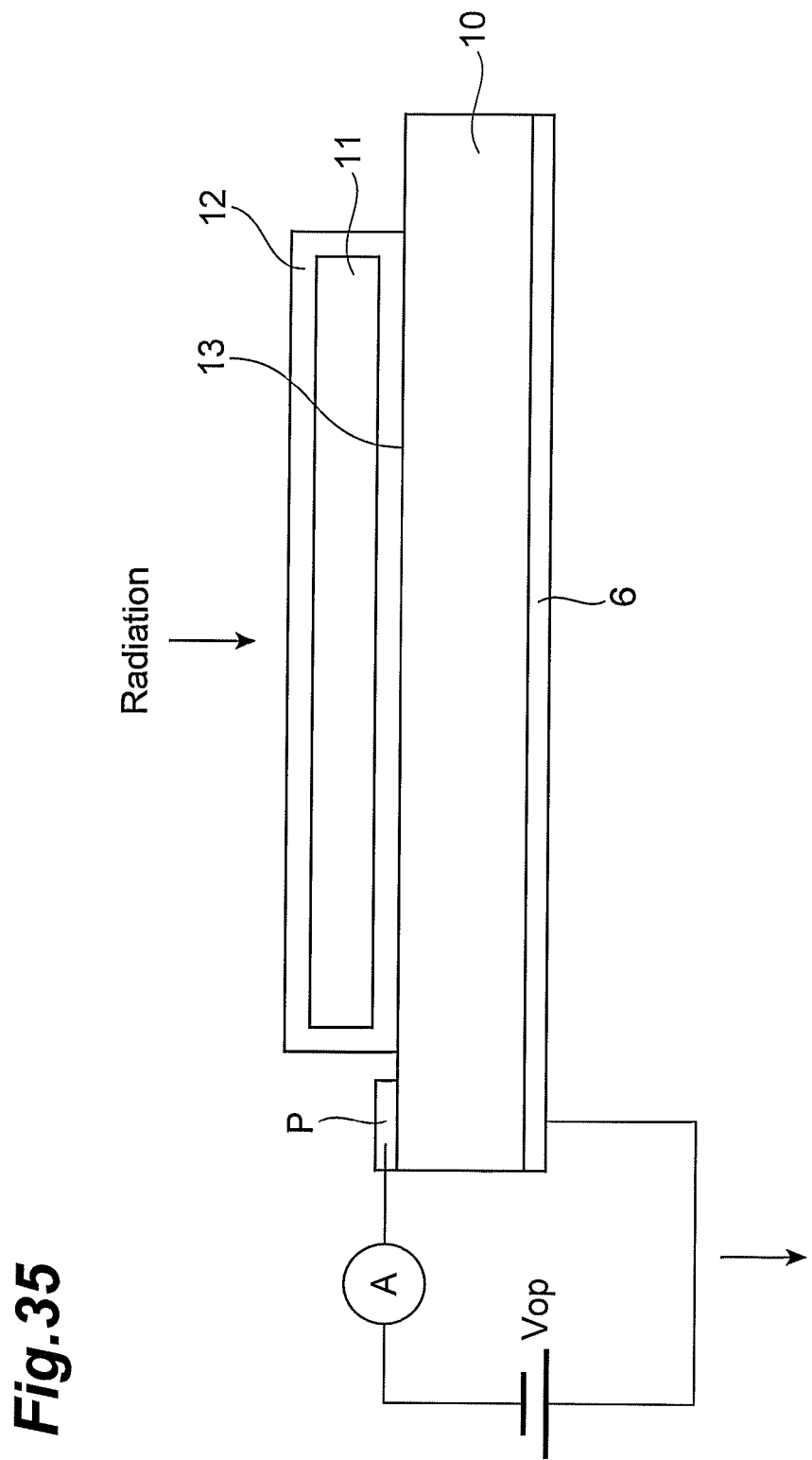
FIG. 35 is a diagram showing a radiation detector including a photodiode array.

FIG. 35 is a diagram showing a radiation detector including a photodiode array.

A scintillator panel is fixed onto the light incident plane of the photodiode array 10. The scintillator panel is composed of a scintillator 11 of CsI or the like, and a covering layer 12 of Polyp-xylylene) or the like, which covers the scintillator 11, and as needed, a matching oil 13 is intercalated between the scintillator panel and the light incident plane of the photodiode array 10. When radiation is made incident onto the scintillator panel, the scintillator 11 emits light, and this light is made incident onto the photodiode array 10. A reverse bias voltage higher than the breakdown voltage is applied between an electrode P and the electrode 6 in the photodiode array 10, and its output may be detected via a detector A. A radiation detector having a good temporal resolution may be applied to an X-ray CT, a PET device, and the like, so that it is possible to measure an image having a resolution which has been unable to be measured.

REFERENCE SIGNS LIST

10 . . . Photodiode array, 1 . . . First semiconductor layer, 2 . . . Second semiconductor layer, 3 . . . Third semiconductor layer, 4 . . . Insulating layer, 5 . . . Ring-shaped electrode, 6 . . . Other electrode, 7 . . . Quenching resistor, 8 . . . Relay wiring, PD . . . Photodiode, WL . . . Peripheral wiring, 9 . . . Peripheral region, 11 . . . Intermediate wiring, WL2 . . . Transverse wiring.

The invention claimed is:

1. A photodiode array comprising:
a plurality of avalanche photodiodes formed within a semiconductor substrate;
quenching resistors which are connected in series to the respective avalanche photodiodes;
a peripheral wiring which surrounds a region in which the plurality of avalanche photodiodes are formed; and
a plurality of relay wirings which are electrically connected to the peripheral wiring, to respectively connect at least two places of the peripheral wiring, the photodiode array wherein
a resistance value per unit length of the peripheral wiring is smaller than a resistance value per unit length of the relay wiring,
one of an anode and a cathode of each of the avalanche photodiodes is electrically connected to any one of the relay wirings via the quenching resistor, and
the other of the anode and the cathode of each of the avalanche photodiodes is electrically connected to another electrode provided on the semiconductor substrate.

2. The photodiode array according to claim 1, further comprising a transverse wiring which is electrically connected to the peripheral wiring, so as to connect at least two places of the peripheral wiring, and whose resistance value per unit length is smaller than a resistance value per unit length of the relay wiring, the photodiode array wherein
one ends of the respective relay wirings are electrically connected to the transverse wiring in place of the peripheral wiring.

3. The photodiode array according to claim 1, further comprising capacitors which are respectively connected in parallel to the respective quenching resistors.

4. The photodiode array according to claim 3, wherein
either anodes or cathodes of the respective avalanche photodiodes are electrically connected to ring-shaped electrodes,
the relay wirings include conductive peripheral regions which are spaced from the ring-shaped electrodes, and are extended so as to surround the ring-shaped electrodes, and
the capacitors have the peripheral regions extended from the relay wirings, and the ring-shaped electrodes.

5. The photodiode array according to claim 4, further comprising intermediate wirings extended in parallel between the relay wirings, wherein
the intermediate wirings respectively connect at least two places of the peripheral wiring, and
the peripheral region continues into the intermediate wirings.

6. The photodiode array according to claim 4, wherein
the peripheral regions are connected to both sides of the respective relay wirings, and
the peripheral regions adjacent to one another are spaced with respect to the relay wirings adjacent to one another.

7. The photodiode array according to claim 3, wherein the respective relay wirings open at regions along center lines thereof.

8. The photodiode array according to claim 3, wherein the capacitor has a covering wiring formed on the quenching resistor via an insulating layer, and one end of the covering wiring is electrically connected to one end of the quenching resistor.

9. The photodiode array according to claim 3, wherein either anodes or cathodes of the respective avalanche photodiodes are electrically connected to ring-shaped electrodes, and an aspect ratio of the ring-shaped electrode is 2 or higher.

* * * * *